United States Patent
Wang

(10) Patent No.: US 6,516,672 B2
(45) Date of Patent: Feb. 11, 2003

(54) SIGMA-DELTA ANALOG TO DIGITAL CONVERTER FOR CAPACITIVE PRESSURE SENSOR AND PROCESS TRANSMITTER

(75) Inventor: Rongtai Wang, Edina, MN (US)

(73) Assignee: Rosemount Inc., Eden Prairie, MN (US)

( * ) Notice: Subject to any disclaimer, the term of this patent is extended or adjusted under 35 U.S.C. 154(b) by 0 days.

(21) Appl. No.: 09/862,762

(22) Filed: May 21, 2001

(65) Prior Publication Data

US 2002/0178827 A1 Dec. 5, 2002

(51) Int. Cl.[7] .................................................. G01L 9/12
(52) U.S. Cl. ...................................................... 73/718
(58) Field of Search ......................... 73/718, 724, 714; 361/283.1, 283.2, 283.3, 283.4; 341/143

(56) References Cited

U.S. PATENT DOCUMENTS

| | | | |
|---|---|---|---|
| 2,533,339 A | 12/1950 | Willenborg | 177/311 |
| 3,012,432 A | 12/1961 | Moore et al. | 73/40 |
| 3,218,863 A | 11/1965 | Calvert | 73/398 |
| 3,232,712 A | 2/1966 | Stearns | 23/255 |
| 3,249,833 A | 5/1966 | Vosteen | 317/246 |
| 3,564,923 A | 9/1967 | Nudd, Jr. et al. | 73/398 |
| 3,374,112 A | 3/1968 | Danon | 117/226 |
| 3,518,536 A | 6/1970 | Lee et al. | 324/57 |

(List continued on next page.)

FOREIGN PATENT DOCUMENTS

| | | |
|---|---|---|
| DE | 3340834 | 5/1985 |
| DE | 37 41 648 | 7/1988 |
| DE | 91 09 176 | 10/1991 |
| DE | 197 45 244 | 4/1998 |
| DE | 299 03 260 | 5/2000 |
| EP | 0 063 685 | 11/1982 |
| EP | 0 167 941 | 6/1985 |
| EP | 0 214 801 | 3/1987 |
| EP | 0 223 300 | 5/1987 |
| EP | 0 268 742 | 6/1988 |
| EP | 0 524 550 | 1/1993 |
| EP | 0 639 039 | 2/1995 |
| EP | 0 903 651 | 3/1999 |
| JP | 58-200119 | 11/1983 |
| JP | 2000121470 | 10/1998 |
| WO | WO 88/01417 | 2/1988 |
| WO | WO 89/02578 | 3/1989 |
| WO | WO 89/04089 | 5/1989 |
| WO | WO 90/15975 | 12/1990 |
| WO | WO 91/18266 | 11/1991 |
| WO | WO 96/34264 | 10/1996 |
| WO | WO 98/48489 | 10/1998 |
| WO | WO 99/53286 | 10/1999 |
| WO | WO 00/23776 | 4/2000 |

OTHER PUBLICATIONS

International Search Report from the European Patent Office for International Application No. PCT/US 01/14521 filed May 4, 2001.

"Notification of Transmittal of the International Search Report or the Declaration" PCT/US01/13993. (Oct. 26, 1999, Feb. 1992, Jul. 1988, Jul. 1995).

U.S. patent application Ser. No. 09/862,762, Wang, filed May 21, 2001.

U.S. patent application Ser. No. 09/867,961, Fandrey et al., filed May 30, 2001.

(List continued on next page.)

Primary Examiner—William Oen
(74) Attorney, Agent, or Firm—Westman, Champlin & Kelly, P.A.

(57) ABSTRACT

A pressure transmitter includes a pressure sensor comprising a pressure cell having an interior to form a main cell cavity and a deflectable diaphragm which deflects in response to an applied pressure. The pressure sensor includes electrodes to compensate for hysteresis. A charge inverter amplifier includes a switch capacitor such that it may be implemented in a single integrated circuit.

26 Claims, 13 Drawing Sheets

U.S. PATENT DOCUMENTS

| | | | |
|---|---|---|---|
| 3,557,621 A | 1/1971 | Ferran | 73/398 |
| 3,657,926 A | 4/1972 | Munson et al. | 73/404 |
| 3,697,835 A | 10/1972 | Satori | 317/246 |
| 3,701,280 A | 10/1972 | Stroman | 73/194 |
| 3,731,072 A | 5/1973 | Johnston | 235/151.3 |
| 3,808,480 A | 4/1974 | Johnston | 317/256 |
| 3,820,095 A | 6/1974 | Wojtasinski et al. | 340/200 |
| 3,869,676 A | 3/1975 | Harrison et al. | 329/204 |
| 3,883,812 A | 5/1975 | Harrison et al. | 329/166 |
| 3,896,374 A | 7/1975 | Delafon | 324/60 |
| 3,924,219 A | 12/1975 | Braun | 338/34 |
| 3,955,070 A | 5/1976 | Suzuki et al. | 235/92 |
| 3,968,694 A | 7/1976 | Clark | 73/398 |
| 4,001,813 A | 1/1977 | Kosakowski | 340/347 |
| 4,008,619 A | 2/1977 | Alcaide et al. | 73/398 |
| 4,054,833 A | 10/1977 | Briefer | 324/60 |
| 4,057,755 A | 11/1977 | Piesche | 324/62 |
| 4,091,683 A | 5/1978 | Delatorre | 737/718 |
| 4,093,915 A | 6/1978 | Briefer | 324/60 |
| 4,120,206 A | 10/1978 | Rud, Jr. | 73/718 |
| 4,125,027 A | 11/1978 | Clark | 73/724 |
| 4,129,863 A | 12/1978 | Gray et al. | 340/347 |
| 4,145,619 A | 3/1979 | Tseng | 307/118 |
| 4,149,231 A | 4/1979 | Bukosky et al. | 363/59 |
| 4,158,217 A | 6/1979 | Bell | 361/283 |
| 4,165,483 A | 8/1979 | Holdren et al. | 324/60 |
| 4,168,518 A | 9/1979 | Lee | 361/283 |
| 4,177,496 A | 12/1979 | Bell et al. | 361/283 |
| 4,180,860 A | 12/1979 | Driscoll et al. | 364/900 |
| 4,187,459 A | 2/1980 | Wolfendale | 324/60 |
| 4,187,460 A | 2/1980 | Dauge et al. | 324/60 |
| 4,187,718 A | 2/1980 | Shibasaki | 73/52 |
| 4,193,063 A | 3/1980 | Hitt et al. | 340/200 |
| 4,200,863 A | 4/1980 | Hodges et al. | 340/347 |
| 4,227,419 A | 10/1980 | Park | 73/724 |
| 4,232,300 A | 11/1980 | Wright et al. | 340/840.39 |
| 4,238,825 A | 12/1980 | Geery | 364/510 |
| 4,242,665 A | 12/1980 | Mate | 340/870.38 |
| 4,250,490 A | 2/1981 | Dahlke | 340/870.37 |
| 4,262,542 A | 4/1981 | Freund, Jr. et al. | 73/861.12 |
| 4,287,501 A | 9/1981 | Tominaga et al. | 338/42 |
| 4,287,553 A | 9/1981 | Braunlich | 361/283 |
| 4,322,775 A | 3/1982 | Delatorre | 361/283 |
| 4,322,977 A | 4/1982 | Sell et al. | 73/701 |
| 4,336,567 A | 6/1982 | Anastasia | 361/283 |
| 4,358,814 A | 11/1982 | Lee et al. | 361/283 |
| 4,370,890 A | 2/1983 | Frick | 73/718 |
| 4,381,677 A | 5/1983 | Rusch et al. | 73/724 |
| 4,386,312 A | 5/1983 | Briefer | 324/60 |
| 4,387,601 A | 6/1983 | Azegami | 73/724 |
| 4,389,895 A | 6/1983 | Rud, Jr. | 73/724 |
| 4,392,382 A | 7/1983 | Myers | 73/708 |
| 4,398,426 A | 8/1983 | Park et al. | 73/724 |
| 4,399,440 A | 8/1983 | Douglas | 340/870.26 |
| 4,403,297 A | 9/1983 | Tivy | 364/579 |
| 4,414,634 A | 11/1983 | Louis et al. | 364/510 |
| 4,419,898 A | 12/1983 | Zanker et al. | 73/861.02 |
| 4,420,753 A | 12/1983 | Meyer-Ebrecht | 340/870.26 |
| 4,422,125 A | 12/1983 | Antonazzi et al. | 361/283 |
| 4,422,335 A | 12/1983 | Ohnesorge et al. | 73/724 |
| 4,434,451 A | 2/1984 | Delatorre | 361/283 |
| 4,446,730 A | 5/1984 | Smith | 73/301 |
| 4,455,874 A | 6/1984 | Paros | 73/704 |
| 4,455,875 A | 6/1984 | Guimard et al. | 73/708 |
| 4,458,537 A | 7/1984 | Bell et al. | 73/718 |
| 4,459,856 A | 7/1984 | Ko et al. | 73/754 |
| 4,467,655 A | 8/1984 | Lee | 73/724 |
| 4,485,673 A | 12/1984 | Stern | 73/304 |
| 4,490,773 A | 12/1984 | Moffatt | 361/283 |
| 4,494,183 A | 1/1985 | Bayer et al. | 364/154 |
| 4,504,921 A | 3/1985 | Nasuta et al. | 364/550 |
| 4,528,855 A | 7/1985 | Singh | 73/721 |
| 4,535,283 A | 8/1985 | Rabinovich | 73/719 |
| 4,542,436 A | 9/1985 | Carusillo | 361/283 |
| 4,550,295 A | 10/1985 | Sasaki | 333/19 |
| 4,562,742 A | 1/1986 | Bell | 73/718 |
| 4,562,744 A | 1/1986 | Hall et al. | 73/861.02 |
| 4,570,490 A | 2/1986 | Antonazzi | 73/701 |
| 4,574,250 A | 3/1986 | Senderowicz | 330/258 |
| 4,598,381 A | 7/1986 | Cucci | 364/558 |
| 4,602,344 A | 7/1986 | Ferretti et al. | 364/509 |
| 4,663,168 A | 12/1986 | Venema | 324/60 |
| D287,827 S | 1/1987 | Broden | D10/46 |
| 4,644,797 A | 2/1987 | Ichikawa et al. | 73/706 |
| 4,644,798 A | 2/1987 | Tamura et al. | 73/708 |
| 4,653,330 A | 3/1987 | Hedtke | 73/756 |
| 4,670,733 A | 6/1987 | Bell | 338/36 |
| 4,677,841 A | 7/1987 | Kennedy | 73/30 |
| 4,743,836 A | 5/1988 | Grzybowski et al. | 324/60 |
| 4,745,810 A | 5/1988 | Pierce et al. | 73/706 |
| D296,995 S | 8/1988 | Lee | D10/46 |
| D297,314 S | 8/1988 | Hedtke | D10/46 |
| D297,315 S | 8/1988 | Pierce et al. | D10/85 |
| 4,783,659 A | 11/1988 | Frick | 340/870.37 |
| 4,791,352 A | 12/1988 | Frick et al. | 324/60 |
| 4,798,089 A | 1/1989 | Frick et al. | 73/706 |
| 4,818,994 A | 4/1989 | Orth et al. | 340/870.21 |
| 4,825,704 A | 5/1989 | Aoshima et al. | 73/861.42 |
| 4,833,922 A | 5/1989 | Frick et al. | 73/756 |
| 4,850,227 A | 7/1989 | Luettgen et al. | 73/708 |
| 4,860,232 A | 8/1989 | Lee et al. | 364/571.04 |
| 4,866,989 A | 9/1989 | Lawless | 73/756 |
| 4,875,369 A | 10/1989 | Delatorre | 73/151 |
| 4,878,012 A | 10/1989 | Schulte et al. | 324/60 |
| 4,881,412 A | 11/1989 | Northedge | 73/861.04 |
| 4,926,674 A | 5/1990 | Fossum et al. | 73/4 |
| 4,930,353 A | 6/1990 | Kato et al. | 73/727 |
| 4,951,174 A | 8/1990 | Grantham et al. | 361/283.1 |
| 4,958,938 A | 9/1990 | Schwartz et al. | 374/208 |
| 4,970,898 A | 11/1990 | Walish et al. | 73/706 |
| 4,977,480 A | 12/1990 | Nishihara | 73/724 |
| 4,980,675 A | 12/1990 | Meisenheimer, Jr. | 340/626 |
| 5,000,047 A | 3/1991 | Kato et al. | 73/706 |
| D317,266 S | 6/1991 | Broden et al. | D10/46 |
| D317,269 S | 6/1991 | Selg | D10/52 |
| D318,432 S | 7/1991 | Broden et al. | D10/46 |
| 5,028,746 A | 7/1991 | Petrich | 191/12.2 R |
| 5,035,140 A | 7/1991 | Daniels et al. | 73/290 |
| 5,058,437 A | 10/1991 | Chaumont et al. | 73/861.21 |
| 5,060,108 A | 10/1991 | Baker et al. | 361/283 |
| 5,070,732 A | 12/1991 | Duncan et al. | 73/431 |
| 5,083,091 A | 1/1992 | Frick et al. | 324/678 |
| 5,087,871 A | 2/1992 | Losel | 323/299 |
| 5,094,109 A | 3/1992 | Dean et al. | 73/718 |
| 5,119,033 A | 6/1992 | Frick et al. | 324/607 |
| D329,619 S | 9/1992 | Cartwright | D10/52 |
| 5,142,914 A | 9/1992 | Kusakabe et al. | 73/723 |
| 5,157,972 A | 10/1992 | Broden et al. | 73/718 |
| 5,162,725 A | 11/1992 | Hodson et al. | 324/115 |
| 5,168,419 A | 12/1992 | Delatorre | 361/283 |
| 5,187,474 A | 2/1993 | Kielb et al. | 340/870.18 |
| 5,194,819 A | 3/1993 | Briefer | 73/718 |
| 5,212,645 A | 5/1993 | Wildes et al. | 364/463 |
| 5,227,782 A | 7/1993 | Nelson | 340/870.11 |
| 5,230,250 A | 7/1993 | Delatorre | 73/733 |
| 5,233,875 A | 8/1993 | Obermeier et al. | 73/718 |
| 5,236,202 A | 8/1993 | Krouth et al. | 277/164 |
| 5,245,333 A | 9/1993 | Anderson et al. | 340/870.3 |
| 5,248,167 A | 9/1993 | Petrich et al. | 285/23 |
| D342,456 S | 12/1993 | Miller et al. | D10/60 |
| 5,287,746 A | 2/1994 | Broden | 73/706 |

| | | | |
|---|---|---|---|
| 5,329,818 A | 7/1994 | Frick et al. | 73/708 |
| 5,343,766 A | 9/1994 | Lee | 73/862.61 |
| 5,353,200 A | 10/1994 | Bodin et al. | 361/816 |
| 5,369,386 A | 11/1994 | Alden et al. | 335/206 |
| 5,377,547 A | 1/1995 | Kusakabe et al. | 73/723 |
| 5,381,355 A | 1/1995 | Birangi et al. | 364/724.01 |
| D358,784 S | 5/1995 | Templin, Jr. et al. | D10/96 |
| 5,424,650 A | 6/1995 | Frick | 324/688 |
| 5,436,824 A | 7/1995 | Royner et al. | 363/89 |
| 5,448,180 A | 9/1995 | Kienzler et al. | 326/15 |
| 5,469,150 A | 11/1995 | Sitte | 340/825.07 |
| 5,471,885 A | 12/1995 | Wagner | 73/862.041 |
| D366,000 S | 1/1996 | Karas et al. | D10/60 |
| D366,218 S | 1/1996 | Price et al. | D10/52 |
| 5,483,834 A | 1/1996 | Frick | 73/724 |
| 5,492,016 A | 2/1996 | Pinto et al. | 73/724 |
| 5,495,768 A | 3/1996 | Louwagie et al. | 73/706 |
| 5,498,079 A | 3/1996 | Price | 374/208 |
| 5,524,333 A | 6/1996 | Hogue et al. | 29/593 |
| 5,524,492 A | 6/1996 | Frick et al. | 73/706 |
| 5,542,300 A | 8/1996 | Lee | 73/724 |
| 5,546,804 A | 8/1996 | Johnson et al. | 73/431 |
| 5,576,483 A | 11/1996 | Bonin | 73/105 |
| 5,600,782 A | 2/1997 | Thomson | 395/182.02 |
| 5,606,513 A | 2/1997 | Louwagie et al. | 364/510 |
| 5,621,399 A | 4/1997 | Gruler | 340/870.37 |
| 5,637,802 A | 6/1997 | Frick et al. | 73/724 |
| 5,642,301 A | 6/1997 | Warrior et al. | 364/571.02 |
| 5,650,936 A | 7/1997 | Loucks et al. | 364/483 |
| 5,656,782 A | 8/1997 | Powell, II et al. | 73/756 |
| 5,661,235 A | 8/1997 | Bonin | 73/105 |
| 5,665,899 A | 9/1997 | Willcox | 73/1.63 |
| 5,668,322 A | 9/1997 | Broden | 73/756 |
| 5,670,722 A | 9/1997 | Moser et al. | 73/756 |
| 5,705,978 A | 1/1998 | Frick et al. | 340/511 |
| 5,710,552 A | 1/1998 | McCoy et al. | 340/870.21 |
| 5,750,903 A | 5/1998 | Ryhanen | 73/861.48 |
| 5,754,596 A | 5/1998 | Bischoff et al. | 375/295 |
| 5,757,608 A | 5/1998 | Bernot et al. | 361/283.4 |
| 5,764,928 A | 6/1998 | Lancott | 395/285 |
| 5,823,228 A | 10/1998 | Chou | 137/597 |
| 4,785,669 A | 11/1998 | Benson et al. | 73/718 |
| 5,869,751 A | 2/1999 | Bonin | 73/105 |
| 5,870,695 A | 2/1999 | Brown et al. | 702/138 |
| 5,899,962 A | 5/1999 | Louwagie et al. | 702/138 |
| 5,911,162 A | 6/1999 | Denner | 73/718 |
| 5,920,016 A | 7/1999 | Broden | 73/756 |
| 5,948,988 A | 9/1999 | Bodin | 73/706 |
| 5,954,526 A | 9/1999 | Smith | 439/136 |
| 5,955,684 A | 9/1999 | Gravel et al. | 73/866.5 |
| 5,973,942 A | 10/1999 | Nelson et al. | 363/21 |
| 5,988,203 A | 11/1999 | Hutton | 137/597 |
| 5,992,240 A | 11/1999 | Tsuruoka et al. | 73/718 |
| 6,005,500 A | 12/1999 | Goboury et al. | 341/43 |
| 6,006,338 A | 12/1999 | Longsdorf et al. | 713/340 |
| 6,026,677 A | 2/2000 | Bonin | 73/105 |
| 6,038,927 A | 3/2000 | Karas | 73/706 |
| 6,050,145 A | 4/2000 | Olson et al. | 73/706 |
| 6,059,254 A | 5/2000 | Sundet et al. | 248/678 |
| 6,105,437 A | 8/2000 | Klug et al. | 73/756 |
| 6,111,888 A | 8/2000 | Green et al. | 370/461 |
| 6,115,831 A | 9/2000 | Hanf et al. | 714/43 |
| 6,123,585 A | 9/2000 | Hussong et al. | 439/652 |
| 6,140,952 A | 10/2000 | Gaboury | 341/143 |
| 6,216,172 B1 | 4/2001 | Kolblin et al. | 709/253 |
| 6,233,532 B1 | 5/2001 | Boudreau et al. | 702/89 |
| 6,285,964 B1 | 9/2001 | Babel et al. | 702/121 |
| 6,295,875 B1 * | 10/2001 | Frick et al. | 73/718 |

OTHER PUBLICATIONS

"Circuit and Technology Considerations for MOS Delta–Sigma A/D Converters", by M. Hauser et al., *IEEE International Symposium on Circuits and Systems*, May 5–7, 1986, pp. 1310–1315.

"A Low–Voltage High Resoltion CMOS A/D Converter with Analog Compensation", by Robert et al., *CICC*, 1986 Conference May 12–15.

Monolithic CMOS–Switch IC Suites Diverse Applications, by J. Williams, *EDN*, Oct. 4, 1984, pp. 183–194.

Deran, Charles, "A New Standard for Electronic D/P Transmitter Selection," Instrument Society of America, National Conference and Exhibit, Oct. 15, 1978, pp. 457–462.

Candy, James C., "A Use of Double Integration in Sigma Delta Modulation," IEEE Transactions on Communications, vol. Com–33, No. 3, Mar. 1985.

Rose, Craig D., "A New Way to Cut the Cost of A–to–D Converters," Electronics, pp. 42–44, Mar. 31, 1986.

Suarez, Ricardo E. et al., "ALL–MOS Charge Redistribution Analog–To–Digital Conversion Techniques–Part II," Reprinted from IEEE J. Solid–State Circuits, vol. SC–10, pp. 379–385, Dec. 1975.

Landsburg, George, "A Charge–Balancing Monolithic A/D Converter," Reprinted from IEEE J. Solid–State Circuits, vol. SC–12, pp. 662–673, Dec. 1977.

McCharles, Robert H. et al., "An Algorithmic Anolog–To–Digital Converter," Reprinted from IEEE International Solid–State Circuits Conference Digest of Technical Papers, pp. 96–97, 1977.

Gregorian, Roubik et al., "Switched–Capacitor Circuit Design," IEEE, vol. 71, No. 8, Aug. 1983.

U.S. patent application Ser. No. 09/671,495, Behm et al., filed Sep. 27, 2000.

U.S. patent application Ser. No. 09/519,781, Neslon et al., filed Mar. 7, 2000.

U.S. patent application Ser. No. 09/520,292, Davis et al., filed Mar. 7, 2000.

U.S. patent application Ser. No. 09/519,912, Nelson et al., filed Mar. 7, 2000.

U.S. patent application Ser. No. 09/672,338, Nelson et al., filed Sep. 28, 2000.

U.S. patent application Ser. No. 09/638,181, Roper et al., filed Jul. 31, 2000.

U.S. patent application Ser. No. 09/571,111, Westfield et al., filed May 15, 2000.

U.S. patent application Ser. No. 09,564,506, Nord et al., filed May 4, 2000.

U.S. patent application Ser. No. 09/667,289, Westfield et al., filed Sep. 22, 2000.

U.S. patent application Ser. No. 09/667,399, Behm et al., filed Sep. 21, 2000.

U.S. patent application Ser. No. 09/671,130, Fandrey et al., filed Sep. 27, 2000.

U.S. patent application Ser. No. 29/120,531, Fandrey et al., filed Mar. 21, 2000.

U.S. patent application Ser. No. 29/120,544, Fandrey et al., filed Mar. 21, 2000.

U.S. patent application Ser. No. 29/120,538, Fandrey et al., filed Mar. 21, 2000.

U.S. patent application Ser. No. 29/120,552, Fandrey et al., filed Mar. 21, 2000.

U.S. patent application Ser. No. 29/120,537, Fandrey et al., filed Mar. 21, 2000.

U.S. patent application Ser. No. 29/120,553, Fandrey et al., filed Mar. 21, 2000.

Product Data Sheet No: 00813–0100–4378, "Model 751 Field Signal Indicator", by Rosemount Inc., Eden Prairie, Minnesota, (1997). No mo.

Product Data Sheet No: 00813–0100–4731, "APEX™ Radar Gauge", by Rosemount Inc., Eden Prairie, Minnesota, (1998). No mo.

Product Data Sheet No: 00813–0100–4640, "Model 3201 Hydrostatic Interface Unit", from the Rosemount Comprehensive Product Catalog, published 1998, by Rosemount Inc., Eden Prairie, Minnesota. No mo.

Product Data Sheet No: 00813–0100–4003, "Model 8800A", by Rosemount Inc., Eden Prairie, Minnesota, (1998). No mo.

Product Data Sheet No: 00813–0100–4773, "Model 8742C –Magnetic Flowmeter Transmitter with FOUNDATION™ Fieldbus", from the Rosemount Comprehensive Product Catalog, published 1998, by Rosemount Inc., Eden Prairie, Minnesota. No mo.

"Rosemount Model 8732C Magnetic Flowmeter Transmitter", by Rosemount Inc., Eden Prairie, Minnesota, (1998). No mo.

Product Data Sheet No: 00813–0100–4263, "Model 444 Alphaline® Temperature Transmitters", by Rosemount Inc., Eden Prairie, Minnesota, (1997). No mo.

Product Data Sheet No: 00813–0100–4769, "Model 3244MV Multivariable Temperature Transmitter with FOUNDATION™ Fieldbus", by Rosemount Inc., Eden Prairie, Minnesota, (1998). No mo.

Product Data Sheet No: 00813–0100–4724, "Models 3144 and 3244MV Smart Temperature Transmitters", by Rosemount Inc., Eden Prairie, Minnesota, (1998). No mo.

Product Data Sheet No: 00813–0100–4738, "Model 3095FB Multivariable™ Transmitter with Modbus™ Protocol", by Rosemount Inc., Eden Prairie, Minnesota, (1996,1997) No mo.

Product Data Sheet No: 00813–0100–4001, "Model 3051 Digital Pressure Transmitter for Pressure, Flow, and Level Measurement", by Rosemount Inc., Eden Prairie, Minnesota, (1998).

Product Data Sheet No: 00813–0100–4698, "Model 2090F Sanitary Pressure Transmitter", by Rosemount Inc., Eden Prairie, Minnesota, (1998). No mo.

Product Data Sheet No: 00813–0100–4690, "Model 2088 Economical Smart Pressure Transmitter", by Rosemount Inc., Eden Prairie, Minnesota, (1998). No mo.

Product Data Sheet No: 00813–0100–4592, "Model 2024 Differential Pressure Transmitter", by Rosemount Inc., Eden Prairie, Minnesota, (1987–1995). No mo.

Product Data Sheet No: 00813–0100–4360, "Model 1151 Alphaline® Pressure Transmitters", by Rosemount Inc., Eden Prairie, Minnesota, (1998). No month.

Product Data Sheet No: 00813–0100–4458, "Model 1135F Pressure–to–Current Converter", by Rosemount Inc., Eden Prairie, Minnesota, (1983, 1986, 1994). No mo.

"Single Chip Senses Pressure and Temperature," *Machine Design*, 64 (1992) May 21, No. 10.

Brochure: "Reduce Unaccounted–For Natural Gas with High–Accuracy Pressure Transmitters," Rosemount Inc. Measurement Division, Eden Prairie, Minnesota, ADS 3073, May 1991, pp. 1–4.

Technical Information Bulletin, "Liquid Level Transmitter Model DB40RL Sanitary Sensor deltapilot," Endress + Hauser, Greenwood, Indiana, Sep. 1992, pp. 1–8.

"The Digitisation of Field Instruments" W. Van Der Bijl, *Journal A*, vol. 32, No. 3, 1991, pp. 62–65. No mo.

Specification Summary, "TELETRANS™ 3508–30A Smart Differential Pressure Transmitter," (undated) Bristol Babcock, Inc., Watertown, CT, 06795. No date.

Specification Summary, "TELETRANS™ 3508–10A Smart Pressure Transmitter," (undated) Bristol Babock, Inc., Watertown, CT, 06795. No date.

Specification Summary, "AccuRate Advanced Gas Flow Computer, Model GFC 3308," (undated) Bristol Babcock, Inc., Watertown, CT, 06795. No date.

Product Data Sheet PDS 4640, "Model 3201 Hydrostatic Interface Unit," Mar. 1992, Rosemount Inc., Eden Prairie, MN 55344.

Product Data Sheet PDS 4638, "Model 3001CL Flush–Mount Hydrostatic Pressure Transmitter," Jul. 1992, Rosemount Inc., Eden Prairie, MN 55344.

"Flow Measurement," *Handbook of Fluid Dynamics*, V. Streeter, Editor–in–chief, published by McGraw–Hill Book Company, Inc. 1961, pp. 14–4 to 14–15. No mo.

"Precise Computerized In–Line Compressible Flow Metering," *Flow –Its Measurement and Control in Science and Industry*, vol. 1, Part 2, Edited by R. Wendt, Jr., Published by American Institute of Physics et al, (undated) pp. 539–540. No Date.

"A Systems Approach," Dr. C. Ikoku, *Natural Gas Engineering*, PennWell Books, (undated) pp. 256–257. No Date.

"Methods for Volume Measurement Using Tank–Gauging Devices Can Be Error Prone," F. Berto, *The Advantages of Hydrostatic Tank Gauging Systems*, undated reprint from *Oil & Gas Journal*. No Date.

"Hydrostatic Tank Gauging –Technology Whose Time Has Come," J. Berto, *Rosemount Measurement Division Product Feature*, undated reprint from *INTECH*. No date.

"Pressure Sensors Gauge Tank Level and Fluid Density," *Rosemount Measurement Division Product Feature*, undated reprint from *Prepared Foods* (Copyrighted 1991 by Gorman Publishing Company). No month.

"Low Cost Electronic Flow Measurement System," *Tech Profile*, May 1993, Gas Research Institute, Chicago, IL.

"Development of an Integrated EFM Device for Orifice Meter Custody Transfer Applications," S.D. Nieberle et al., *American Gas Association Distribution/Transmission Conference & Exhibit*, May 19, 1993.

Advertisement, AccuRate Model 3308 Integral Smart DP/P/T Transmitter, (undated) Bristol Babcock, Inc., Watertown, CT 06795. No date.

Advertisement, Model 3508 DP Transmitter, *Control Engineering*, Dec. 1992, Bristol Babcock, Inc., Watertown, CT 06795.

"Smart Transmitters Tear Up The Market," C. Polsonetti, *INTECH*, Jul. 1993, pp. 42–45.

"MicroLAN Design Guide", Dallas Semiconductor, Tech Brief No. 1, (undated). No date.

"Bosch CAN Specification Version 2.0", by Robert Bosch GmbH, pp. 1–68, including pp. –1–and –2–, (Sep. 1991).

Product Data Sheet No: 00813–0100–4001, "Digital Pressure Transmitter for Pressure, Flow, and Level Measurement", by Rosemount Inc., (1998). No mo.

"Claudius Ptolemy (100?–170? AD)", *M&C News*, 7 pages, (Apr. 1994).

American National Standard, "Hydraulic Fluid Power–Solenoid Piloted Industrial Valvues–Interface Dimensions for Electrical Connectors", National Fluid Power Association, Inc., 10 pages, (Aug. 1981).

2 pages downloaded from http://www.interlinkbt.com/PRODUCT/IBT_PROD/DN/CN–DM_PN/EURO–DP.HTM dated Sep. 15, 2000.

4 pages downloaded from http://www/interlinkbt.com/PRODUCT/IBT_PROD/dn/EUR–CON/euro–fwc.htm dated Sep. 15, 2000.

3 pages from TURK Cable Standards, by Turk, Inc., Minneapolis, Minnesota. No date.

"Notification of Transmittal of the International Search Report or Declaration" for International application Serial No. PCT/US00/26561. Dates on references.

"Notification of Transmittal of the International Search Report or Declaration" for International application Serial No. PCT/US00/26488. Dates on references.

"Notification of Transmittal of the International Search Report or Declaration" for International application Serial No. PCT/US00/26563. Dates on references.

Electronic Design, Sep. 6, 1984, "Design Entry, Clocked v–f converter tightens accuracy and raises stability," pp. 235–244.

Control Engineering, May, 1982, "User Concern for Controller–to–Computer Link Delays Analog Signal Interface Phaseout," pp. 82–85.

EDN, Jan. 10, 1985, "Digitize transducer outputs directly at the source," pp. 291–298.

IEEE Transactions on Industrial Electronics and Control Instrumentation, IECI 22, No. 3, Aug. 1975, "Capacitance to Time–Period Conversion Using Modified Astable Multivibrator".

* cited by examiner

SIGMA-DELTA ANALOG TO DIGITAL CONVERTER FOR CAPACITIVE PRESSURE SENSOR AND PROCESS TRANSMITTER

CROSS REFERENCE TO RELATED APPLICATION

The present application is cross-referenced to U.S. patent application Ser. No. 09/312,411, filed May 14, 1999, and entitled "PROCESS PRESSURE MEASUREMENT DEVICES WITH IMPROVED ERROR COMPENSATION, which is hereby incorporated by reference in its entirety.

BACKGROUND OF THE INVENTION

The present invention relates to process transmitters of the type used to monitor industrial processes. More specifically, the present invention relates to an analog to digital converter used in such a device in a technique which reduces or suppresses hystersis.

Transmitters are devices which are used to monitor the operation of industrial processes. For example, transmitters are used to measure process variables such as pressure, temperature, flow, conductivity and pH of a process and provide an output related to the measured process variable. Frequently, a transmitter is located at a remote location and transmits the measured process variable back to a central control room.

The pressure of a process fluid (both liquid or gas) can be used to determine various types of information about the process. For example, process pressure can be used to measure flow rate of process fluid through a restriction or the level of process fluid in a container. One type of pressure sensor used in process transmitters is a deflectable diaphragm. As pressure is applied to one or both sides of the diaphragm, the diaphragm deflects. The deflection of the diaphragm can be detected by measuring a change in a ratio of electrical capacitance related to the deflection. This capacitance ratio is converted into a digital format using an analog to digital converter. One specific type of analog to digital converter which can be used in process transmitters is known as a sigma-delta converter. A sigma-delta converter for use in a process transmitter is shown and described in U.S. Pat. No. 5,083,091, entitled CHARGE BALANCED FEEDBACK MEASUREMENT CIRCUIT which issued on Jan. 21, 1992 and is incorporated herein by reference. Sigma-delta analog to digital converters offer high accuracy with relatively low power requirements. They are thus well suited for use in process transmitters which are typically required to be powered from the same two-wire process control loop used to transmit the process variable.

One problem with typical prior art sensors is hysteresis in deflection of the diaphragm. This can lead to errors in pressure measurements. There is a desire to improve the accuracy of pressure measurements obtained using deflectable diaphragms and a sigma delta converter, and to do so in a manner that improves accuracy, is inexpensive and reduces power consumption.

SUMMARY OF THE INVENTION

The present invention provides a technique for suppression of hysteresis error in pressure measurements using a compensation electrode on a deflectable diaphragm and an efficient circuit for implementing a sigma delta converter. The circuitry is preferably implemented on a single integrated circuit and used in a diaphragm/sigma delta converter system to suppress hysteresis in pressure measurement for increased accuracy. In one example, a process pressure transmitter has a deflectable diaphragm and analog to digital (A/D) converter arrangement, the A/D converter uses a charge inverter configuration that reduces power consumption and can be fabricated on the same chip as the other A/D converter circuitry thus providing cost savings in manufacturing. In one aspect, the charge inverter includes a switch capacitor.

DETAILED DESCRIPTION OF THE PREFERRED EMBODIMENTS

The present invention relates to process pressure transmitters of the type used to sense a pressure of a process using a deflectable diaphragm. The invention relates to a diaphragm configuration which is set forth in co-pending application Ser. No. 09/312,411, entitled PROCESS PRESSURE MEASUREMENT DEVICES WITH IMPROVED ERROR COMPENSATION, filed May 14, 1999 which is assigned to the present assignee and is incorporated herein by reference. This pressure sensor configuration can be used to reduce errors in pressure measurements due to hysteresis of the diaphragm. A sigma delta analog to digital converter is used to measure a diaphragm deflection which is related to applied pressure. With the present invention, the analog to digital converter includes a charge inverter amplifier having a switch capacitor configuration suitable for implementation on a single integrated circuit and which offers improved accuracy and reduced power consumption. Further, the gain of the charge inverter amplifier is programmable which allows the system to be easily calibrated.

Figure 1:
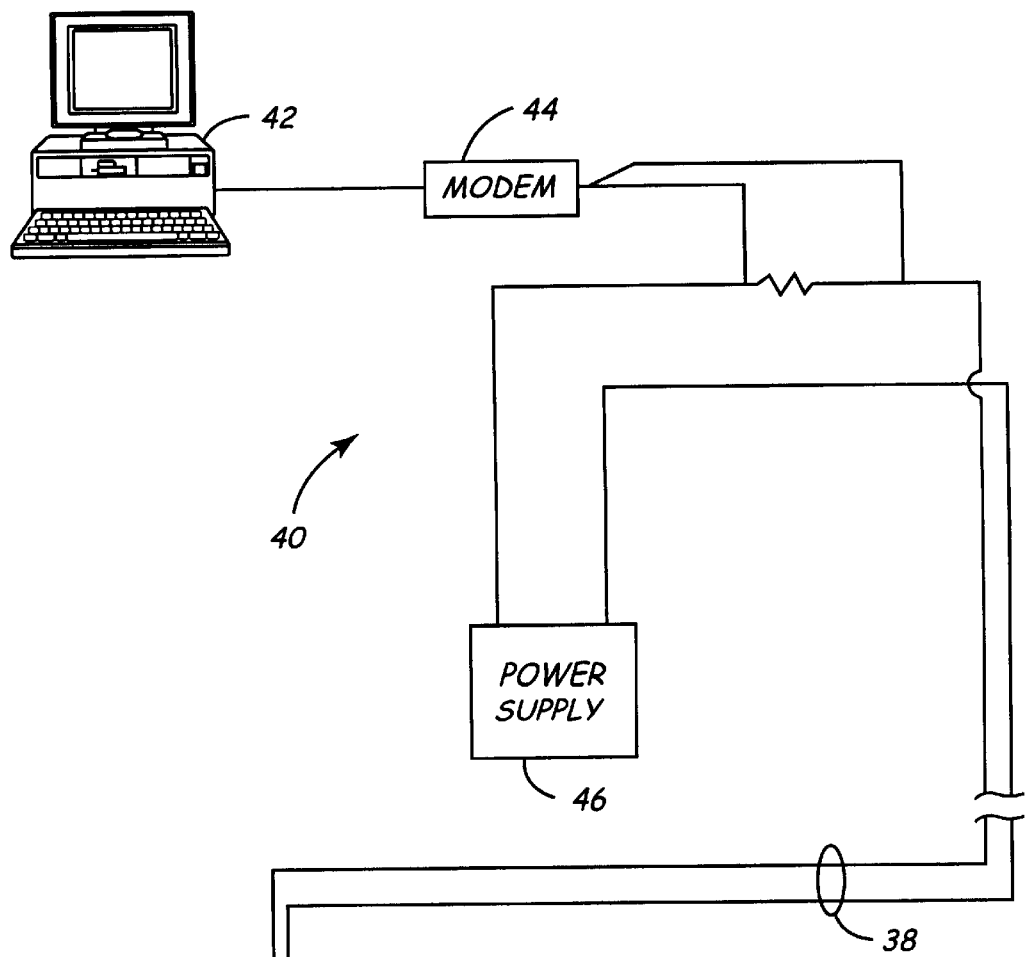
FIG. 1 is a simplified diagram showing a differential pressure transmitter coupled to process piping.
Figure 1:
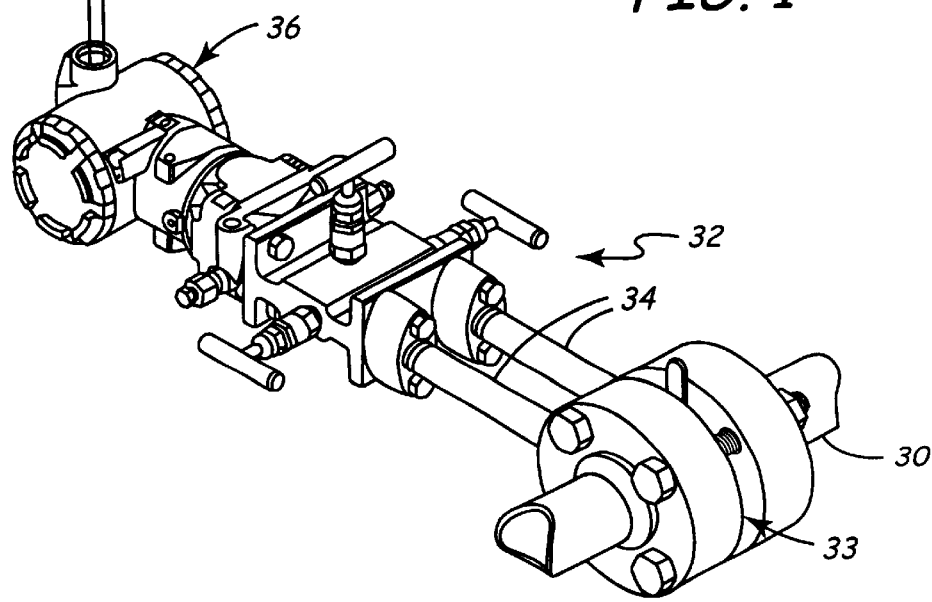

FIG. 1 shows generally the environment of a process measurement system 32. FIG. 1 shows process piping 30 containing a fluid under pressure coupled to the process measurement system 32 for measuring a process pressure. The process measurement system 32 includes impulse piping 34 connected to the piping 30. The impulse piping 34 is connected to a process pressure transmitter 36. A primary element 33, such as an orifice plate contacts the process fluid at a location in the process piping 30 between the pipes of the impulse piping 34. The primary element 33 causes a pressure change in the fluid as it passes past the primary element 33.

Transmitter 36 is illustrated as a differential pressure transmitter which is used to measure flow of process fluid through piping 30. Differential pressure is the difference in magnitude between two pressure values, e.g., the difference between two process pressures input to a transmitter. A process loop 38 provides both a power signal to the transmitters 36 and bidirectional communication, and can be constructed in accordance with a number of process communication protocols. A computer 42 or other information handling system through modem 44, or other network interface communicates with the transmitter 36. A remote voltage power supply 46 powers the transmitter 36.

Figure 2:
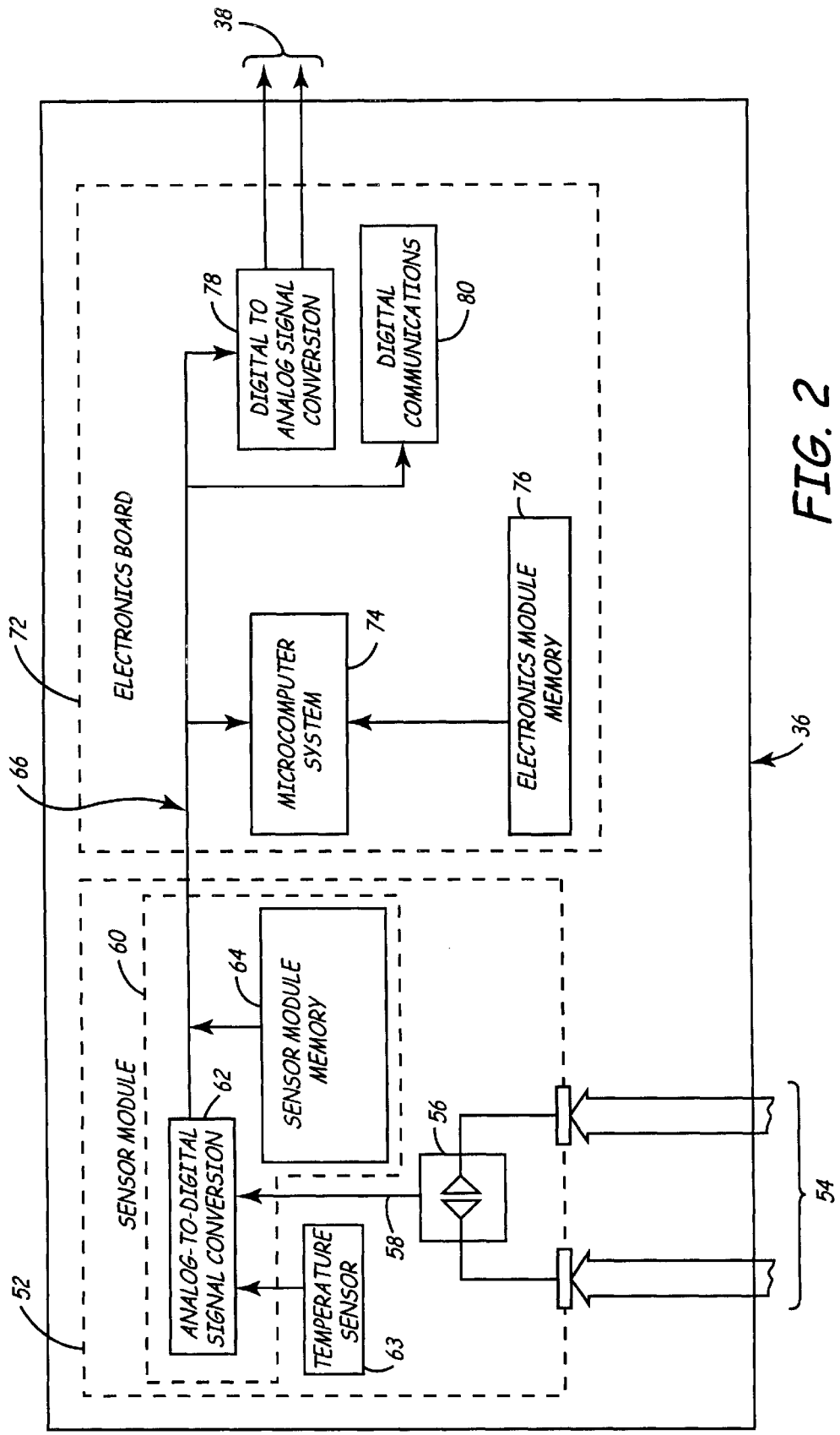
FIG. 2 is a simplified block diagram of the pressure transmitter of FIG. 1.

FIG. 2 shows a block diagram of transmitter 36 of FIG. 1. A process pressure 54 is applied to pressure sensor 56 of the sensor module 52 which provides an analog electrical signal 58 representative of differential pressures. The signal 58 is processed and converted to a digital signal at sensor module electronics 60 that includes an analog to digital converter 62 in accordance with the invention and a sensor module memory 64. Memory 64 contains specific information about the sensor module and correction coefficients for the sensor module 52. A temperature sensor 63 provides an analog signal representative of ambient temperature to the sensor electronics 60. The created digital signal is output over a cable 66.

A microprocessor system 74 and memory 76 further condition the digital signal. A digital to analog converter 78 or digital communication circuitry 80 generates and receives either an analog or digital transmission signal over the loop 38, and is therefore often referred to as a "communication circuit."

Figure 3:
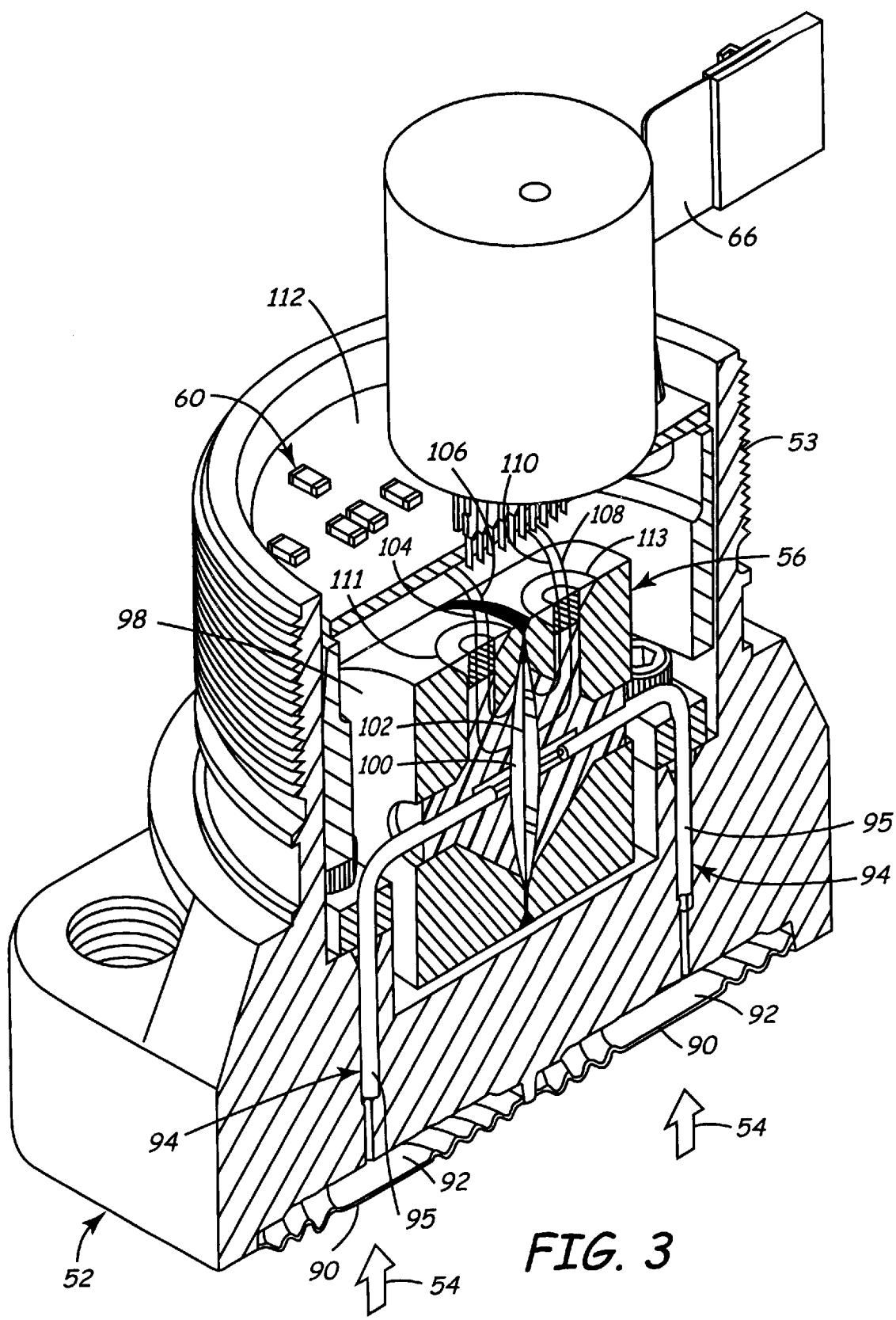
FIG. 3 is a perspective cross-sectional view of a sensor module of the pressure transmitter of FIG. 1.

FIG. 3 shows a sectioned view of the sensor module 52. Differential process pressures 54, typically in the form of a process fluid (gas or liquid) is applied to the sensor module 52 at isolation diaphragms 90. Each isolation diaphragm 90 deflects in response to the applied process pressures 54 within its isolation chamber 92. The isolation chambers 92 are in communication with isolation tubes 94 filled with a fill-fluid 95 that transfer the applied process pressures 54 to a sensor 56, which is also indicated schematically at 56 in FIG. 2. The sensor 56 includes a cell body 98 with an interior cavity 100 filled with the fill-fluid 95. A sensing diaphragm 102, separates the interior cavity 100 into two generally equal and opposite cavity halves, and deflects in response to the process pressure 54 as transferred into the interior cavity 100. The displacement of the deflected diaphragm 102 is proportional to the difference in pressure between the two halves of the cavity 100. The position of the diaphragm 102 with respect to the cavity 100 is detected with capacitor electrodes shown in FIG. 4 within the cavity 100 which form electrical capacitors having capacitances which vary in response to diaphragm displacement due to applied pressure. Lead wires 104, 106, 108, 110 extend through openings 111 and 113 and connect capacitor electrodes to a sensor electronics board 112, containing sensor electronics 60. Sensor 56 converts the differential process pressure into a variable capacitance which can be used to generate an analog electrical signal, and the sensor electronics 60 convert the analog electrical signal into a digital electrical signal.

Figure 4:
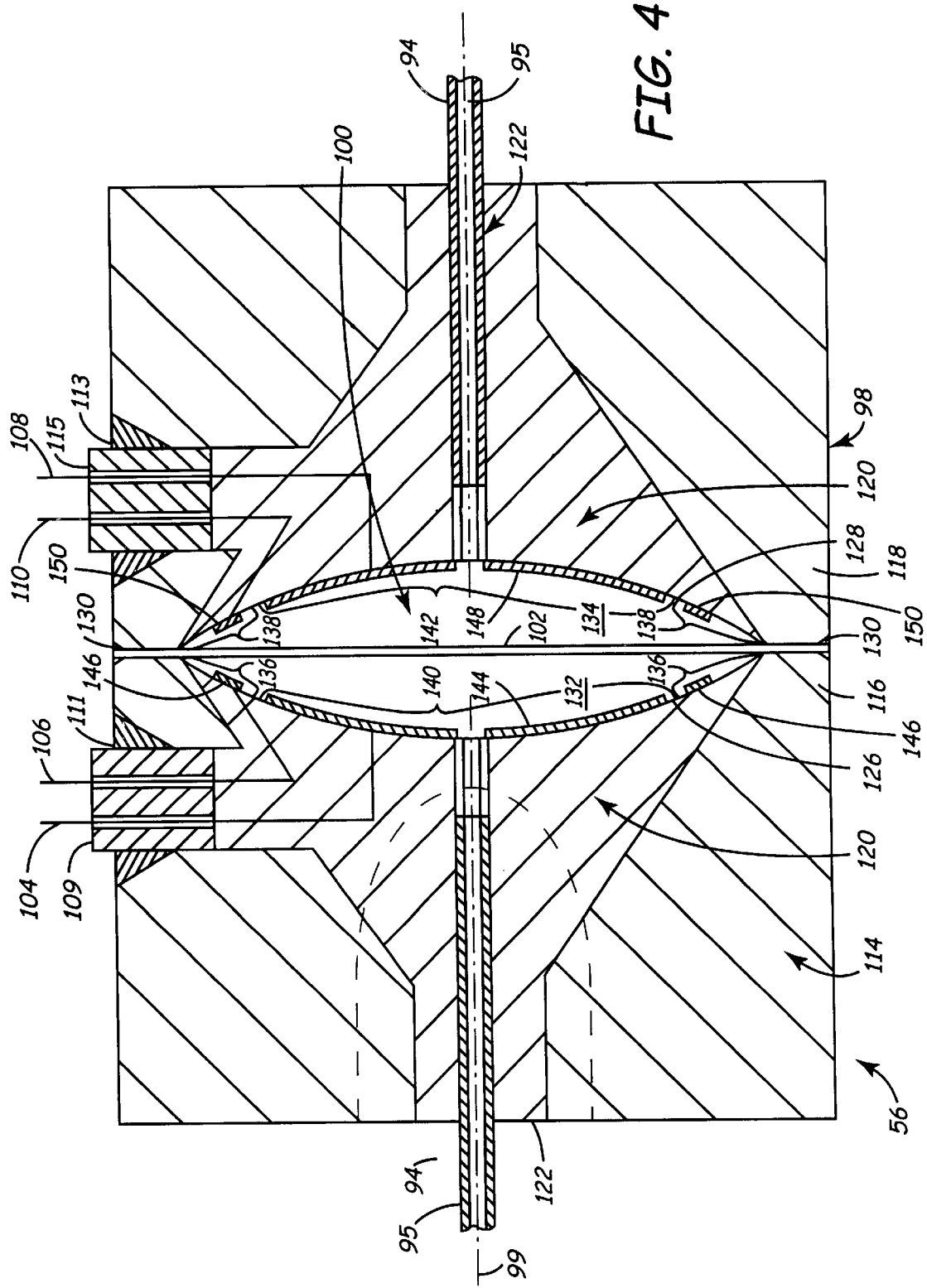
FIG. 4 is a cross-sectional view of a pressure sensor shown in the pressure sensor module of FIG. 3.
Figure 5:
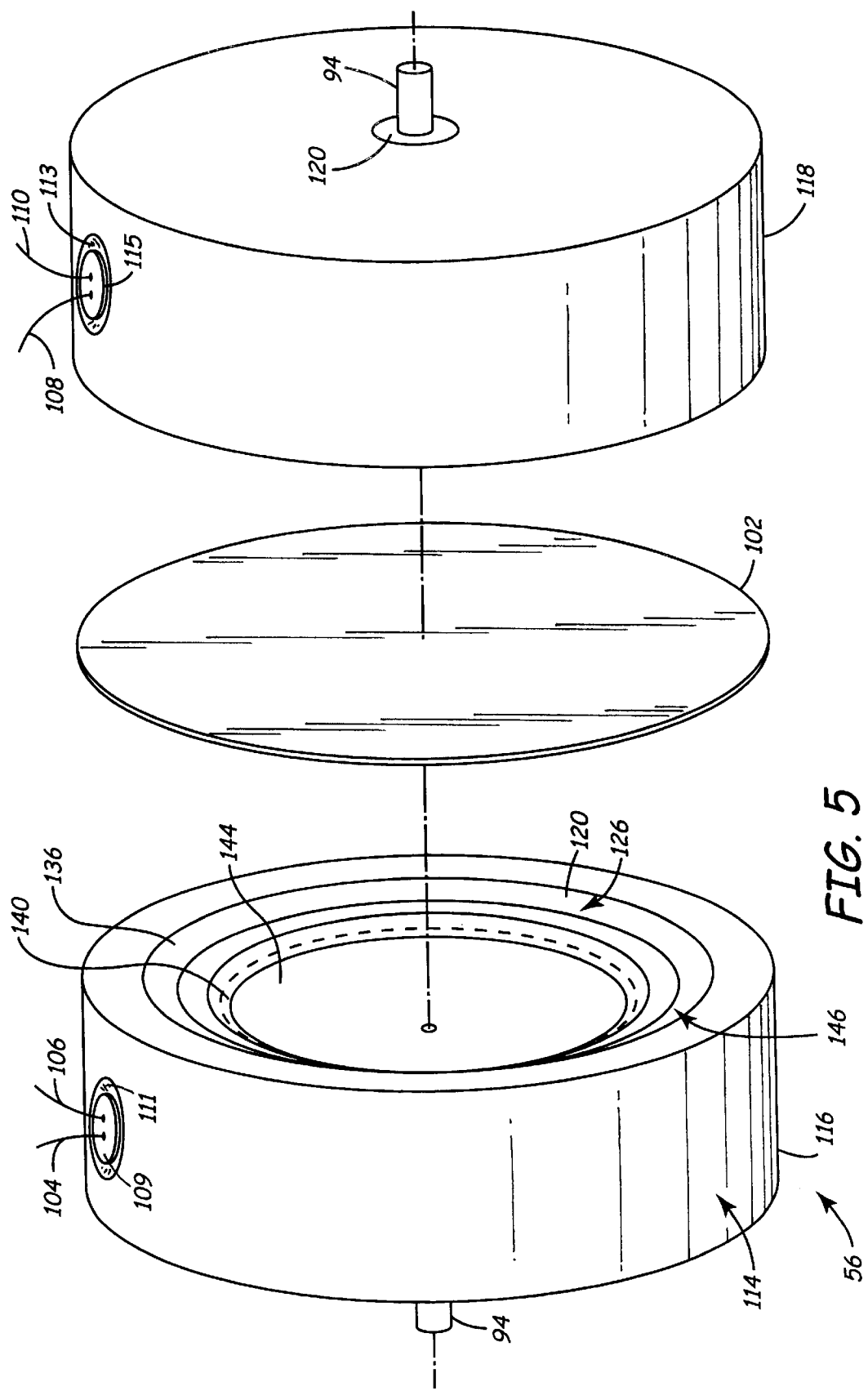
FIG. 5 is an exploded perspective view of the sensor cell of FIG. 4.

FIG. 4 shows a detailed cross-sectional view of the sensor 56, and FIG. 5 shows an exploded perspective view. Cell body 98 includes a metal housing 114 formed of two cup-like halves 116, 118 each filled with a rigid insulator 120 such as ceramic or glass fused to the metal housing 114. The insulator 120 includes openings 122 in communication with isolation tubes 94. The concave surface of halves 116 and 118 is referred to as a first interior wall 126 and a second interior wall 128. Diaphragm 102 is placed between the two halves 116, 118, stretched taut, and preferably welded into place with a continuous weld bead 130. At least a portion of the diaphragm 102 includes an electrically conductive material. In the example shown in FIGS. 4 and 5, the diaphragm 102 is a conductive thin metal membrane. Diaphragm 102 separates the interior cavity 100 into a first cavity 132 and a second cavity 134. The interior walls 126, 128 are separated into edge regions 136, 138 and center regions 140, 142, respectively.

A first (main or center main) electrode 144 formed by a thin metal coating is coupled to the first interior wall 126. The main electrode 144 is connected to lead wire 104 which extends through ceramic plug 109 in opening 111. A second (compensation or edge) electrode 146 couples to lead on wall. In the example shown in FIG. 5, the compensation electrode 146 extends around the first electrode 144. Similarly, third (main) and fourth (compensation) electrodes 148 and 150 are positioned on wall 128 of cavity 134 and mirror electrodes 144 and 146, respectively. Electrodes 148 and 150 couple to lead wires 108 and 110, respectively, which extend through ceramic plug 115 in opening 113.

The electrodes 144–150 operate as electrical capacitor elements or plates with the diaphragm 102, and each are electrically coupled via an electric field, i.e. "capacitively coupled," across the dielectric fill-fluid 95 to the diaphragm 102. Thus, electrodes 144–150 and the diaphragm 102 form first, second, third and fourth capacitors, i.e., two main capacitor and two compensation capacitors. The second and fourth capacitors are hysteresis compensation capacitors as discussed below. Electrodes 144–150 are fixed with respect to the movable diaphragm 102 and thus have capacitances which vary in response to diaphragm deflection due to applied pressure. Specifically, the capacitance of a capacitor generally is proportional to the inverse of the distance between the capacitor plates of the capacitor.

In FIG. 4, the diaphragm 102 is shown as straight and flat indicating equal pressures in the first and second cavities 132, 134. When a pressure difference exists between the cavities 132, 134, the diaphragm deflects from its original position. Ideally, the shape of a deflected diaphragm 102 is parabolic and generally matches the spherical contour of the interior walls. In actuality, diaphragm 102 does not deflect in an ideal manner. Instead, the diaphragm 102 becomes offset but flat after it is initially deflected. The diaphragm 102 extends into one cavity or the other when ideally it should be flat throughout. In general, this offset is caused by edge-bending moments originating at the region 152 where the diaphragm 102 physically contacts the first and second interior walls 126, 128. Error compensation using compensation electrodes 146 and 150 is provided to compensate for this hysteresis offset error. With error correction, two distances of diaphragm deflection from a selected position, or reference plane, are measured and subtracted from each other to arrive at a value proportional to an error corrected output. This error correction can be performed in the analog to digital converter.

Sensor 56 is operably coupled to an analog to digital converter 62, such as a capacitance-to-digital converter shown in FIG. 2. The invention includes a sigma delta converter configured to reduce hysteresis in pressure measurements. One feature that distinguishes a sigma delta circuit from other types of analog to digital converters is that the sigma delta converter provides a balancing feedback current with a polarity controlled by a clocked controller coupling to an integrator. Converter 62 includes a sigma delta and charge inverter circuit and can be implemented as an application specific integrated circuit (ASIC).

Figure 6:
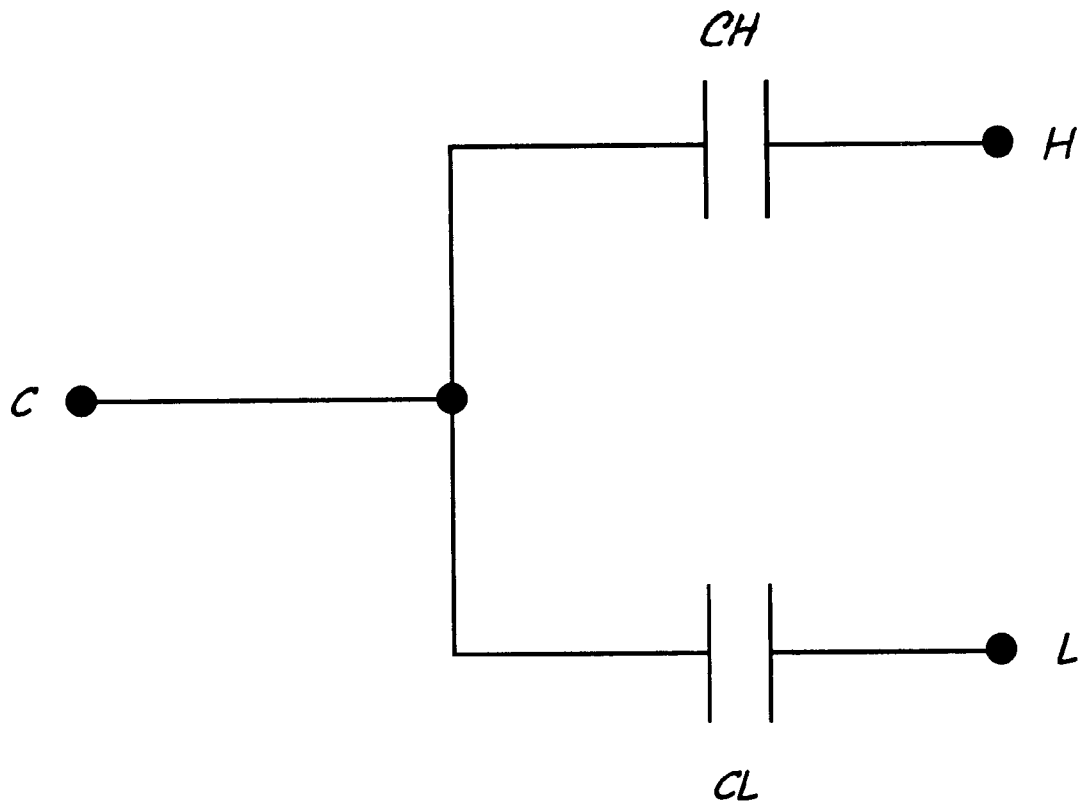
FIG. 6 is an electrical circuit model of a prior art capacitive pressure sensor.

Sigma delta analog to digital converters are known in the art and can be configured as capacitance to digital converter. The input of the converter is capacitance and the output is a digital value. An example of input capacitance network is shown as FIG. 6, where $C_H$ and $C_L$ are two main capacitors, A is a common plate formed by diaphragm 102, H is a high side terminal, L is a low side terminal. For differential pressure sensor applications, both $C_H$ and $C_L$ are pressure dependent. In this case, a digital reading generated by a the converter measures the capacitance ratio $(C_H-C_L)/(C_H+C_L)$. This reading is then mapped to the differential pressure.

Figure 7:
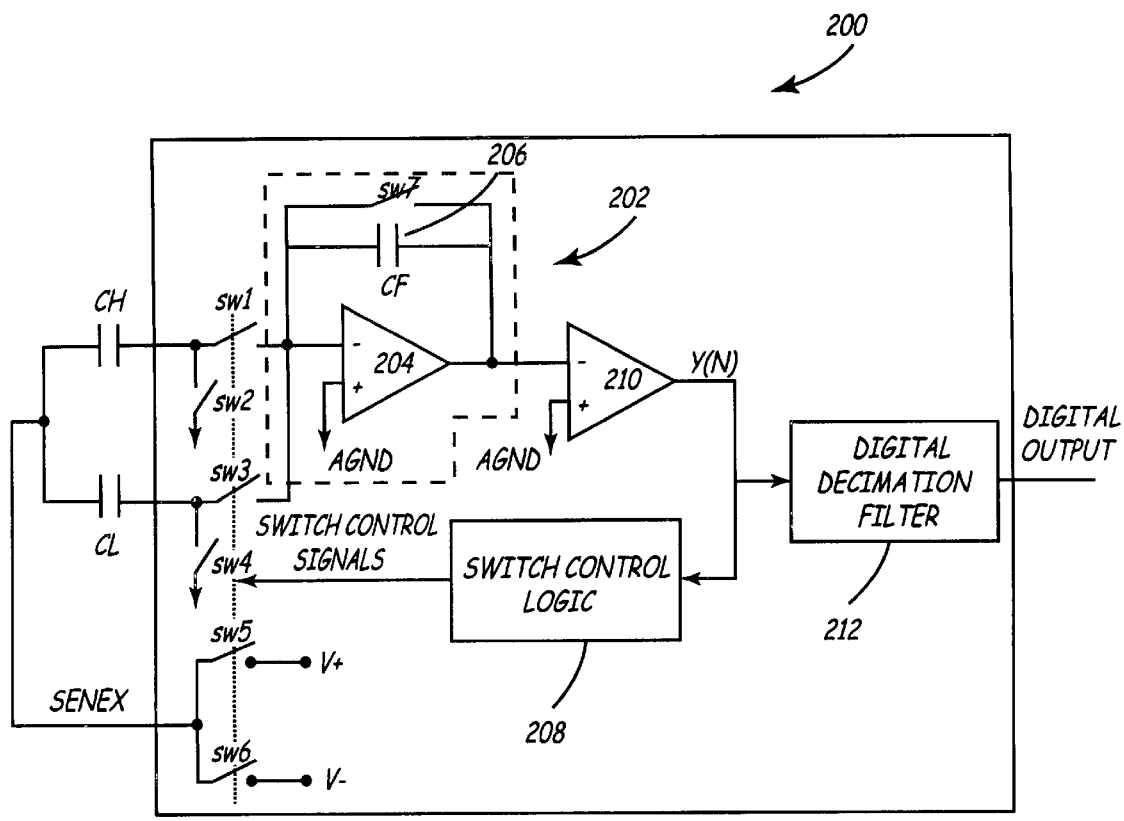
FIG. 7 is a simplified diagram of a first order sigma-delta analog to digital converter coupled to the pressure sensor circuit model of FIG. 6.
Figure 7:
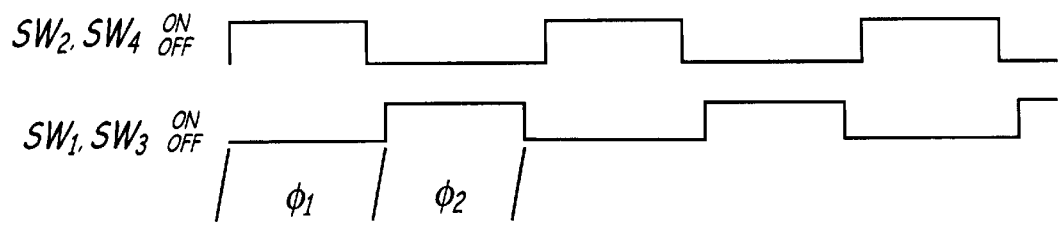

To illustrate the basic operation principle of a sigma delta converter, a simplified first order sigma delta charge to digital converter 200 is shown as FIG. 7. An integrator 202 can be formed by an operational amplifier 204, feedback capacitor CF 206 and switches $SW_1$, $SW_2$, $SW_3$, $SW_4$ and $SW_7$. The common plate of the sensor capacitors is connected to an excitation signal named as SENEX, which is a two level signal controlled by switch $SW_5$ and $SW_6$. All switches are controlled by switch control logic 208. These switches are driven by non-overlapping clocks $\Phi_1$ and $\Phi_2$ shown in FIG. 7. During $\Phi_1$, $SW_2$ or $SW_4$ is on and the charge is stored on capacitors $C_H$ or $C_L$. During $\Phi_2$, the stored charge is pumped to the integrator 202. For example, suppose SENEX is $V^+$ during $\Phi_1$, when SENEX jumps to $V^-$ during $\Phi_2$, a negative charge package is pumped into integrator 202 and a positive voltage incremental is created. Similarly, suppose SENEX is $V^-$ during $\Phi_1$, when SENEX jumps to $V^+$ during $\Phi_2$, a positive charge package is pumped into integrator 202 and a negative voltage incremental is created. The operation of the switches is controlled such that the input capacitor $C_H$ always contributes a positive voltage incremental, while $C_L$ always contributes a negative voltage incremental. If $V_{EX}$ is defined as $V^+-V^-$, then the step size of each incremental associated with $C_H$ or $C_L$ is $\Delta V=V_{EX}(C_H/C_F)$ or $\Delta V=V_{EX}(C_H/C_F)$, respectively. A comparator 210 and switch control logic 208 is designed such that when the integrator output voltage is negative, the charge stored in $C_H$ is integrated and a positive voltage step $\Delta V=V_{EX}(C_H/C_F)$ is created. Similarly, when the integrator output is positive, the charge stored in $C_L$ is integrated and a negative voltage step $\Delta V=V_{EX}(C_L/C_F)$ is created. If N is the number of consecutive clock cycles $\Phi_1$, $\Phi_2$, then $N=N_H+N_L$, where $N_H$ is the number of positive integration, $N_L$ is the number of negative integration. Since a sigma delta converter is a negative feedback system, the balance between positive and negative integration implies $N_H V_{EX}(C_H/C_F)=N_L V_{EX}(C_L/C_F)$. This means $N_L/N_H=C_H/C_L$, or $(N_L-N_H)/N=(C_H-C_L)/(C_H+C_L)$. The function of the digital filter 212 is to provide an average reading of $N_L$. Since the decimation rate N is a constant, $N_H$ can be found as $N_H=N-N_L$. Therefore, the digital reading of $(N_L-N_H)/N$, which measures $(C_H-C_L)/(C_H+C_L)$, can be generated. Because $C_H$ and $C_L$ are related to pressure, this ration can be used to determine the applied differential pressure.

Figure 8:
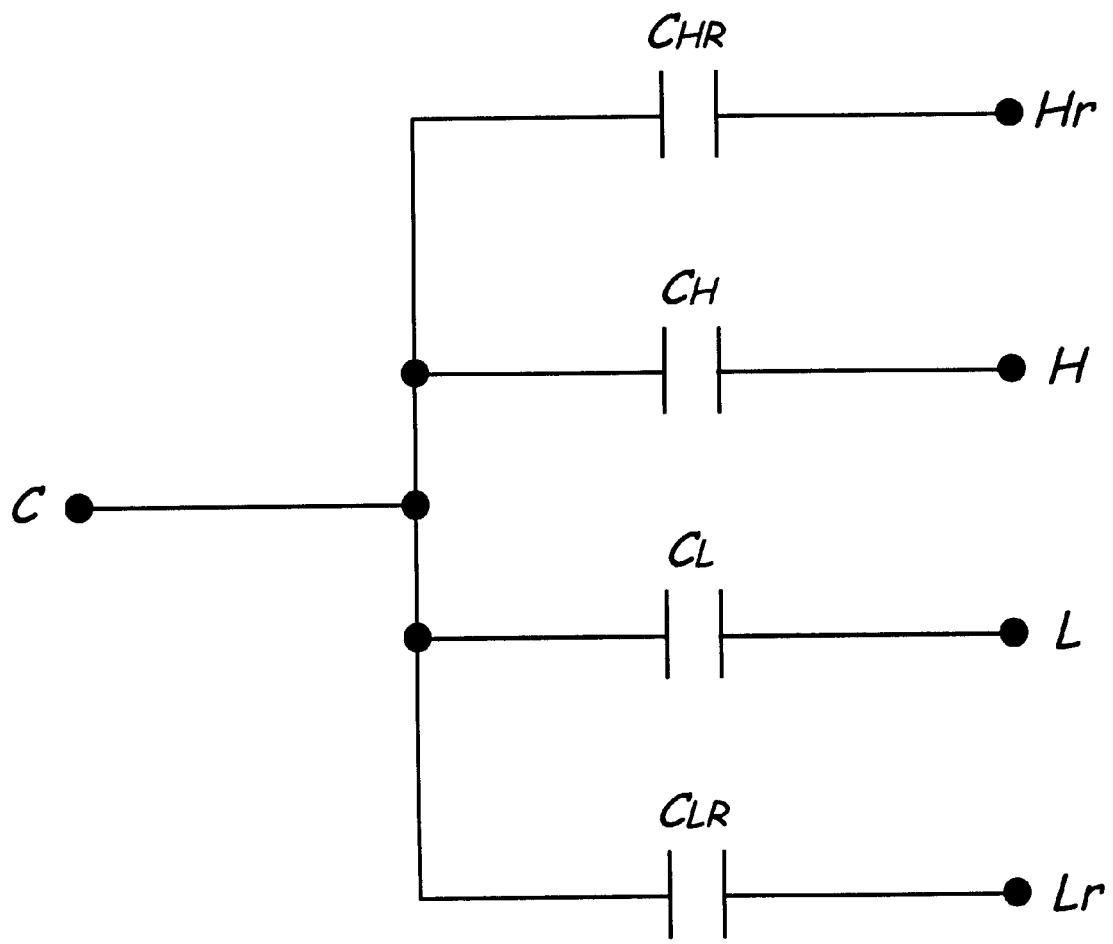
FIG. 8 is a simplified circuit model of a pressure sensor including compensation capacitors for reducing hysteresis.
Figure 9:
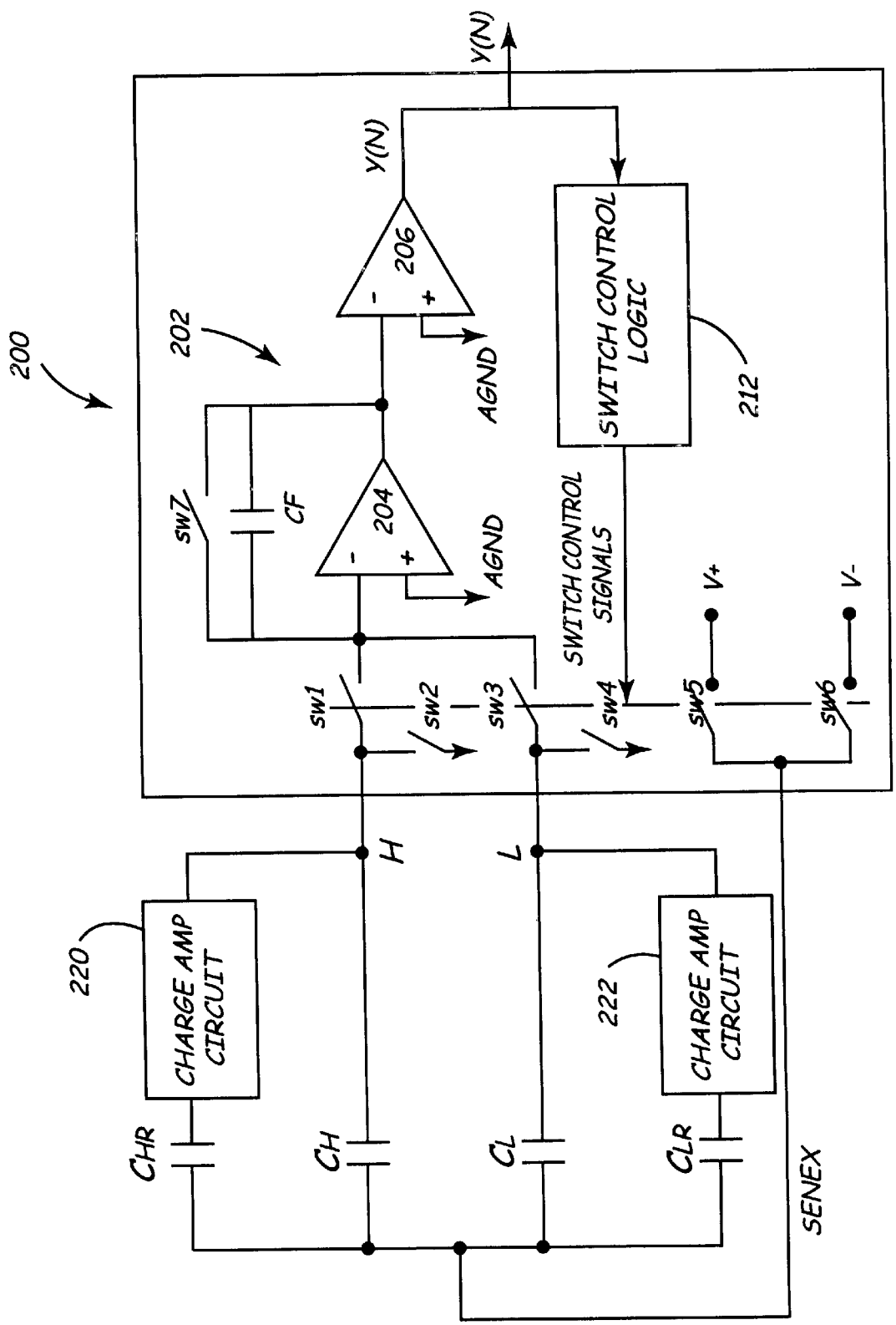
FIG. 9 is an simplified electrical diagram of a first order sigma-delta analog to digital converter of the pressure transmitter of FIG. 1 coupled to the pressure sensor circuit model of FIG. 8.

The present invention reduces hysteresis errors or diaphragm offset errors in pressure measurements using a sigma delta converter and a pressure sensor having error compensation capacitors formed by electrodes 146 and 150 as shown in FIG. 4. The compensation capacitors provide a hysteresis compensation function. The sensor capacitance model of this configuration is shown in FIG. 8, where additional error compensation ring shaped capacitors, $C_{HR}$ and $C_{LR}$ formed by electrodes 146 and 150 of FIG. 4, are added to compensate for hysteresis. The main capacitors, $C_H$ and $C_L$, are formed by electrodes 144 and 148, respectively. The desired capacitance ratio under measurement is $[(C_H-k_H C_{HR})-(C_L-k_L C_{LR})]/[(C_H-k_H C_{HR})+(C_L-k_L C_{LR})]$, where $k_H$ and $k_L$ are the gains of charge amplifiers 220 and 222. Note that since all four capacitors, $C_{HR}$, $C_H$, $C_L$ and $C_{LR}$ share a common plate, it is impossible to create opposite charge packets at node H or at node L. Therefore, two amplifiers 220 and 222 are employed to serve as a charge inverter gain stage and compensated for hysterysis as shown in FIG. 9.

There are several disadvantages to using a discrete operational amplifier in circuits 220 and 222. First, because of the input resistance and small amplifier slew current, integrator settling is slow which will introduce a measurement error for high sampling frequency applications. Second, such an amplifier must be implemented on a separate external integrated circuit and such external amplifiers and other components introduce leakage paths and noise. Third, external circuits are not power-efficient or area-efficient and the circuit consumes additional power and area on the circuit board. Finally, the cost of a multiple chip implementation is always higher than a single chip implementation.

With the present invention, a charge amplifier circuit is implemented using a switch capacitor configuration which is suitable for implementation on a single chip, integral with the sigma delta converter. This technique solves the slow settling problems and therefore can operate at a high sampling frequency. The technique is particularly suitable for single chip implementation. This design reduces power, area, and cost of the circuitry. The leakage source and noise source associated with external circuitry is also greatly suppressed through such a single chip implementation. The circuit offers improved measurement resolution and accuracy.

Three circuit implementation embodiments using switched-capacitor technique are described below. In one aspect, the charge amplifier includes a zeroing switch method. Another is a charge amplifier which uses a sample-and-hold method. In a third embodiment, a charge amplifier is shared between $C_{HR}$ and $C_{LR}$. The gain of the charge amplifier can be programmable. Diagnostic functions, such as open lead detection, can also be implemented as discussed below.

Figure 10:
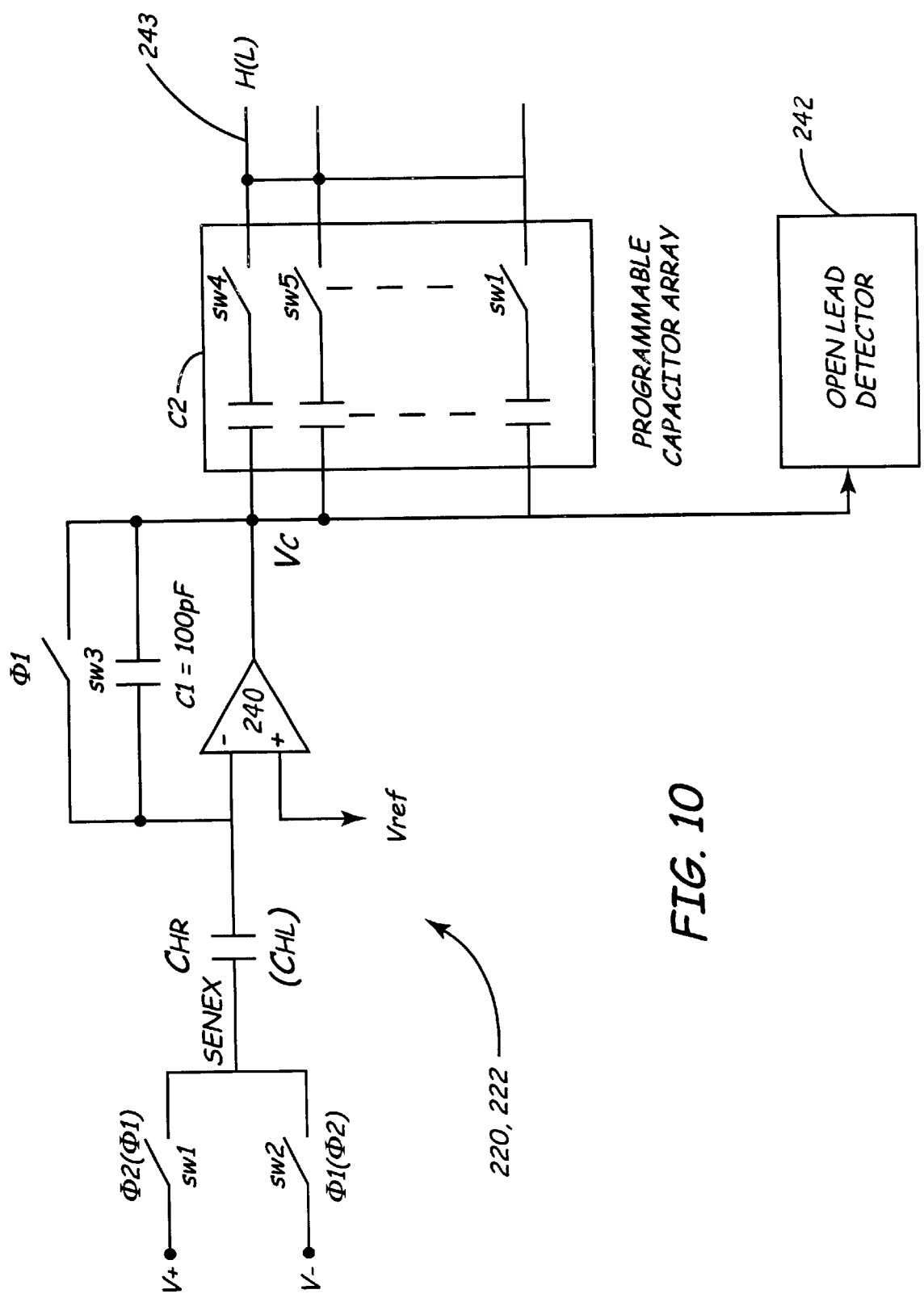
FIG. 10 is a simplified diagram of a charge inverting amplifier for the sigma-delta analog to digital converter of FIG. 9.

In FIG. 10, charge amplifier 220 or 222 is based upon a switched-capacitor technique through introduction of a zeroing switch $SW_3$. $SW_1$ and $SW_2$ are switches which create the SENEX signal. During $\Phi_1$, with the zeroing switch $SW_3$ on, the amplifier 240 forms a unity-gain-amplifier and the output of amplifier 240 is equal to $V_{ref}$ (if the offset voltage of the amplifier 240 is ignored). During $\Phi_2$, with $SW_3$ on, the charge stored in $C_{HR}$ is pumped into the feedback capacitor $C_1$, and a voltage incremental is created at the output of amplifier 240. If the transition of the SENEX signal is negative (i.e., SENEX is connected to $V^+$ during $\Phi_1$ and connected to $V^-$ during $\Phi_2$), then a positive voltage incremental will be created at the output of amplifier 240. Therefore, the capacitor $C_2$ receives a positive excitation. Since the polarity of this excitation is opposite to that of SENEX, the charge contributed by $C_2$ is opposite to that of sensor capacitor $C_{HR}$ or $C_{HL}$. The voltage incremental is equal to $V_{ex}C_{HR}/C_1$. The charge created from capacitor $C_2$ is $V_{ex}C_{HR}(C_2/C_1)$, where the factor $C_2/C_1$ is the gain of amplifier 220,222. The capacitance $C_2$ shown in FIG. 10 can be programmed by actuating switches $SW_4$ through $SW_{11}$. Therefore, the gain of charge amplifier 220,222 is programmable. This can be particularly beneficial because the pressure measurement can be calibrated by adjusting the gain of the charge inverting amplifier 220, 222. Furthermore, because the magnitude of the output 243 during $\Phi_2$ is proportional to capacitance of $C_{HR}$ (or $C_{LR}$), it is possible to design amplifier 220, 222 such that it has sufficient capability to drive additional circuitry.

As shown in FIG. 10, an open lead detector circuit 242 can be provided. This detector 242 can be a simple comparator or another analog to digital converter. As an example, if the capacitance due to electrode 146 or 150 (FIG. 4) during normal operation is between about 20 pf and 80 pf, then the magnitude of the voltage incremental will be between about 0.5V and 2.0V. If the connection to an electrode is broken, the capacitance will drop below 6 pf and the corresponding output voltage will drop below 0.15V. Detector 242 can comprise a comparator circuit to serve as an open lead detector.

Figure 11:
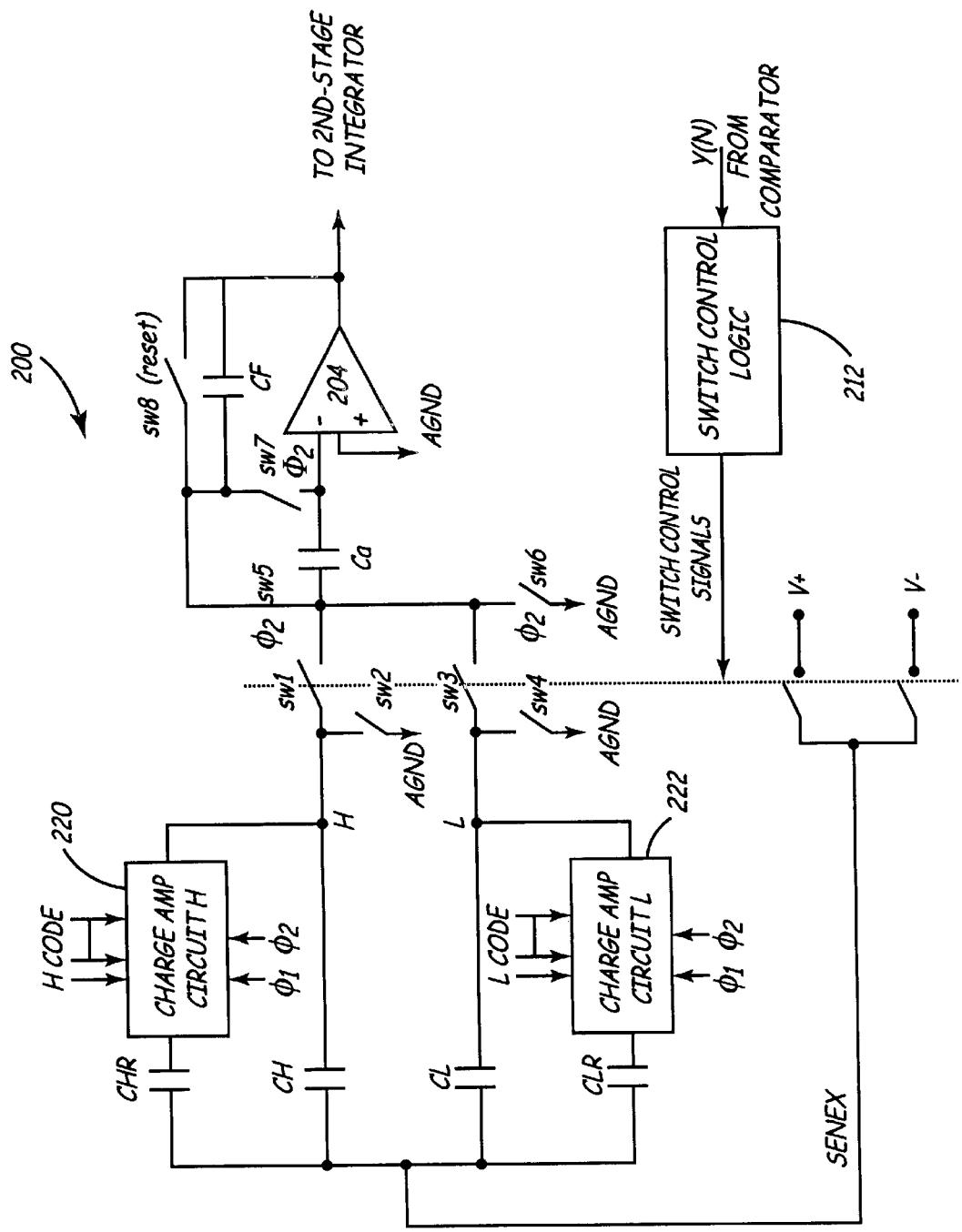
FIG. 11 is a diagram of a sigma-delta analog to digital converter similar to FIG. 9 which includes a programmable charge amplifier and which is coupled to a second stage integrator.

In order to suppress the error introduced by the offset of the amplifier 204, an analog to digital converter 200 with a switched-capacitor offset cancellation technique is shown in FIG. 11. In this embodiment, an offset sample-and-hold capacitor $C_a$ and switches $SW_3$, $SW_4$ provide offset cancellation voltages. The operation mechanism is as follows. During $\Phi_1$, $SW_4$ and $SW_5$ are on, and the feedback capacitor $C_F$ is discharged at the same time the input offset voltage is stored in $C_a$. The voltage at the output-node of amplifier 204 is equal to the reference voltage, Vref, plus the offset voltage, $V_{offset}$, of the amplifier output 204. During $\Phi_2$ high $SW_3$ is on, the charge package stored in $C_{HR}$ is pumped into amplifier 204 feedback capacitor $C_F$. Because an offset cancellation voltage is stored in $C_a$, the charge pumped into the integrator capacitor $C_F$ is $V_{Ref}C_{HR}$ and the voltage step created at the end of a clock cycle is Vc=Vex $C_{HR}/C_1$.

In above implementation, the amplifier 204 must charge or discharge $C_{HR}$. In practice, a settling time is required to create the voltage step. In order to increase the sampling frequency, the settling time of charge amplifier 204 should be reduced as much as possible. This is achieved using the charge amplifiers as shown in FIG. 11.

In FIG. 11, an H code and an L code are the programmable digital inputs to control the gain of amplifiers 220 and 222, respectively. The H code and L code are determined in a product calibrating phase. Because only a single zeroing switch is used, clock $\Phi_1$ is used to operate that switch. In FIG. 11, amplifier 204 serves as first stage integrator. $SW_7$ is used as an auto-zero switch, which turns on during $\Phi_1$ high and stores the offset of amplifier 204 into input capacitors $C_a$. $SW_1$–$SW_6$ are controlled by feedback signal of y(n), such that the positive integration and negative integration are balanced. In order to improve the resolution, a second stage integrator can be implemented (not shown). The output of the second stage integrator is directly connected to a comparator (not shown). The output Y(n) of the comparator is sent to a digital filter (not shown), at the same time it is fed back to switch control logic 212. The digitally filtered signal y(n) is related to the sensed pressure. In FIG. 11, capacitor $C_a$ is designed to store the offset voltage of amplifier 204. $SW_6$ and $SW_7$ sample and hold this offset voltage on $C_a$. $SW_8$ is a reset switch that resets the feedback capacitor $C_F$.

Figure 12:
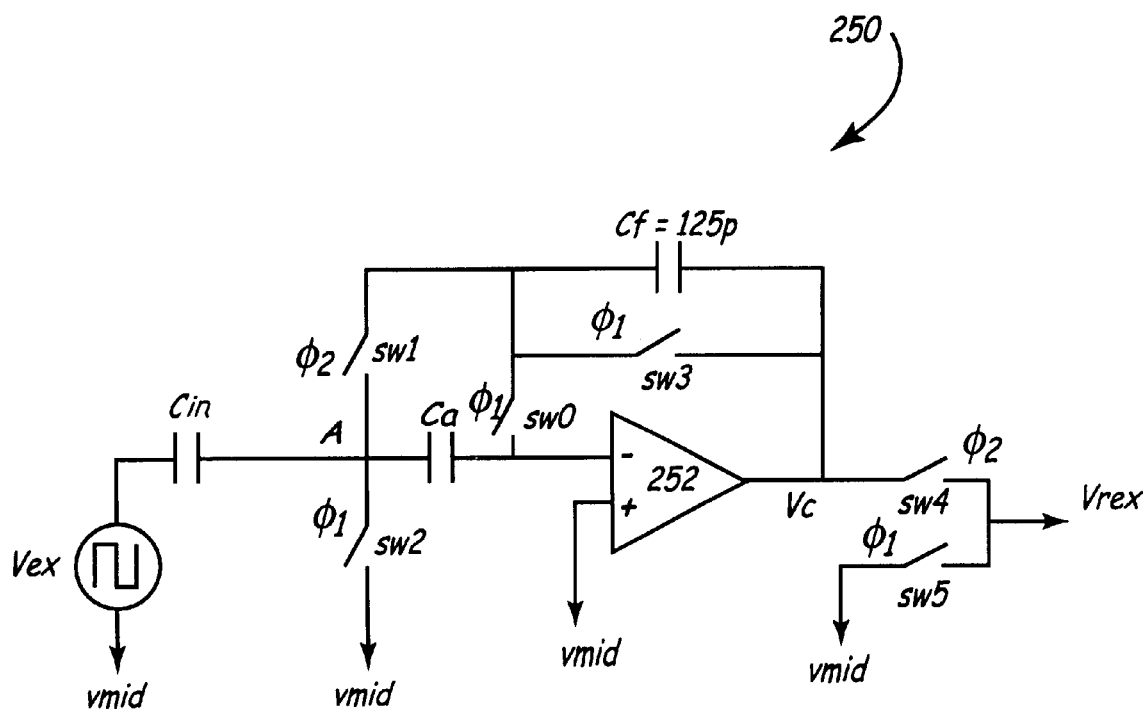
FIG. 12 is a diagram of a charge inverting amplifier which includes auto-zero offset compensation.

FIG. 12 shows a charge inverting or reverse excitation amplifier 250 having auto-zeroing offset compensation. Operation is as follows: Assume the voltage supply is 5.0 v and $V_{mid}$=2.5 v. Symmetric excitation is employed, that is, the high level of $V_{ex}$ is 3.75 v and the low level of the excitation input $V_{ex}$ is 1.25 v. During the auto-zero phase $\Phi_1$ which is the high value of a clock signal $\Phi_1$, $SW_3$ is on. The charge stored in the feedback capacitor $C_f$ is dissipated and the voltage drop on $C_f$ is reset to zero. At the same time, $SW_0$ and $SW_2$ are on, $SW_1$ is off and the offset voltage of the amplifier 252 is stored in the capacitor $C_a$. Further, since $SW_4$ is off and $SW_5$ is on, $V_{rex}$ is directly connected to $V_{mid}$ with a voltage of 2.5 v. If the excitation $V_{ex}$ polarity is negative during the auto-zero phase $\Phi_1$, as $SW_2$ is closed, the voltage drop across $C_{IN}$ is +1.25. $C_{IN}$ is connected to node A which stays at 2.5 v which the other side of $C_{IN}$ is at 3.75 v. When the excitation edge in $V_{EX}$ occurs, the voltage of $V_{ex}$ rises from 3.75 v to 1.25 v and the terminal of input capacitor $C_{IN}$ connected to node. A substantially instantaneously jumps to 0 v. An excess negative charge package $\Delta Q$=2.5 v*$C_{IN}$ is created at node A. $SW_1$ is on, $SW_0$, $SW_2$ and $SW_3$ are off. This configures the feedback capacitor $C_F$ and amplifier 252 to form an integrator. The excess charge $\Delta Q$=–2.5 v*$C_{IN}$ stored in node A is then transferred into $C_F$ and a positive voltage step is created at amplifier output node $V_c$. At the same time, $SW_4$ is on and $SW_5$ is off, the inverted output $V_{rex}$ is directly connected to $V_c$, with a settling voltage of ($C_{IN}$*2.5 v/$C_f$+$V_{mid}$). The charge inverting amplifier 250 of FIG. 12 transforms a negative excitation into a positive excitation. Similarly, the charge inverting amplifier 250 can transform a positive excitation into a negative excitation. Based on above, a relationship between input excitation magnitude $\Delta V_{ex}$ and output excitation magnitude, $\Delta V_{rex}$ can be established as:

$$\Delta V_{rex} = -\Delta V_{ex} \frac{C_{in}}{C_f} \qquad \text{EQ. (1)}$$

This shows that the magnitude of $\Delta V_{rex}$ is proportional to the input capacitance value of capacitor $C_{IN}$ in FIG. 12.

In previous examples, two reverse excitation units and two gain stages (formed by a binary code controlled capacitor array) are employed, one for high-side compensation capacitor $C_H$ and the other for low-side compensation capacitor $C_L$. In another aspect, a shared reverse excitation and gain stage is provided. In such an embodiment, the total current consumption and chip area are reduced.

Figure 13:
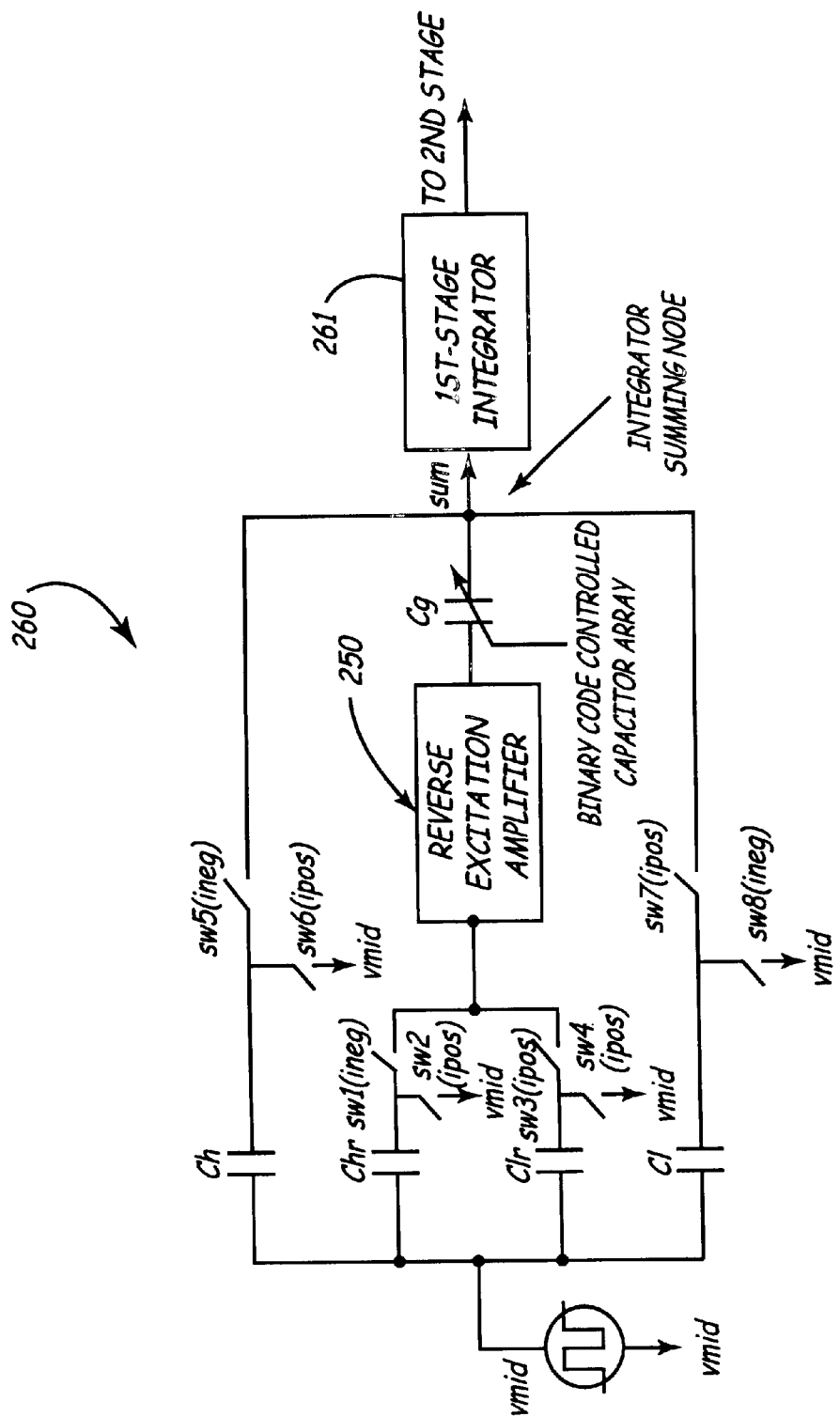
FIG. 13 is a simplified diagram of a single shared charge inverting amplifier which can be used to replace two individual charge amplifiers.

A simplified charge to digital modulator front-end interface circuit 260 with a shared reverse excitation amplifier 250 and a programmable gain stage is shown in FIG. 13. The operation of this circuit is as follows. A pair of complementary logic signals, ipos and ineg, are provided. During ipos=1, ineg=0, $SW_1$ is off and $SW_2$ is on, and the high-side compensation capacitor $C_{HR}$ is disconnected from the reverse excitation amplifier 250. At the same time, $SW_5$ is off and $SW_6$ is on, and the high-side main capacitor $C_H$ is also disconnected from the summing node of the integrator 261. During ipos=1, ineg=0, $SW_3$ is on and $SW_4$ is off, and the low-side compensation capacitor $C_{LR}$ is connected to the reverse excitation unit amplifier 250. At the same time, the capacitance of $C_g$ under this control code is denoted as $C_{gl}$. The charge contributed to the summing node is:

$$\Delta Q_{lr} = \Delta V_{rex} C_{gl} = -\Delta V_{ex} \frac{C_{in}}{C_f} C_{gl} \qquad \text{EQ. (2)}$$

During ipos=1, ineg=0, $SW_7$ is on and $SW_8$ is off, and the low-side main capacitor $C_L$ is connected to the summing node of the integrator 261. The charge contribution to the integrator 261 is:

$$\Delta Q_l = \Delta V_{ex} C_L \qquad \text{EQ. (3)}$$

Therefore, during ipos=1, ineg=0, the high-side sensor capacitors are disconnected from the integrator 261, while the low-side sensor capacitors contribute charge to the integrator 261. The total charge contributed in one sampling period is:

$$\Delta Q_{l,total} = \Delta V_{ex} C_L - \Delta V_{ex} k_l C_{LR} \qquad \text{EQ. (4)}$$

Where $k_1 = C_{gl}/C_f$ is the programmable gain of the low-side compensation capacitor (for example, let $C_f$=125 pf and $C_{gl}$=50 pf, then $k_l$=0.40).

Similarly, operation of the switches can be arranged such that during ipos=0, ineg=1, the low-side sensor capacitors are disconnected from the integrator, while the high-side sensor capacitors contribute the charge to the integrator. In this case, the total charge contributed in one sampling period is:

$$\Delta Q_{h,total} = \Delta V_{ex} C_H - \Delta V_{ex} k_h C_{HR} \qquad \text{EQ. (5)}$$

Where $k_h = C_{gh}/C_f$ is the programmable gain of the high-side compensation capacitor.

The polarity of excitation source $V_{ex}$ can be controlled in a such a way that the charge $\Delta Q_{l,tot}$ has the opposite sign of $\Delta Q_{h,tot}$. N is denoted as the decimation duration, $N_h$ as the number of clock cycles performed on the high-side capacitors, and $N_l$ as the number of clock cycles performed on low-side capacitors. The balance equation of the first stage integrator (ignoring the initial charge and any residual charge stored in the first stage integrator) can be expressed as:

$$N_h(\Delta V_{ex} C_H - \Delta V_{ex} k_h C_{HR}) = N_l(\Delta V_{ex} C_L - \Delta V_{ex} k_l C_{LR}) \qquad \text{EQ. (6)}$$

This equation leads to a relation:

$$\frac{N_h}{N_l} = \frac{C_L - k_l C_{LR}}{C_H - k_h C_{HR}} \qquad \text{EQ. (7)}$$

Since $N = N_h + N_l$, the transfer function can be equivalently rewritten as:

$$\frac{N_l - N_h}{N} = \frac{(C_H - k_h C_{HR}) - (C_L - k_l C_{LR})}{(C_H - k_h C_{HR}) + (C_L - k_l C_{LR})} \qquad \text{EQ. (8)}$$

With the circuit of FIG. 13, the rising or falling edge of the reverse excitation signal is not as sharp as that of the input excitation signal. This is due to the limited slew current. A larger slew current is required to create a sharp edge in the reverse excitation signal. This requires a large current consumption by the amplifier. If the maximum compensation capacitance is 100 pf and the gain stage capacitor is 68.75 pf (for gain 0.55), then the total charge transfer which must be performed by the amplifier is 387.5 pQ. If the integration phase is about 7.5 μsec for 66 kHz operation, the slew period must be in the range of 1.5 μsec (only 6.0 μsec for settling). This implies a slew current of at least about 260 μA and the static current will be close to 400 μA. Therefore, use of a shared reverse excitation technique will reduce current consumption by about 400 μA.

To further reduce the current consumption, an approach of non-equal phase sampling method can be used. With this aspect, the time duration of phase $\Phi_2$ is increased by reducing the time duration of phase $\Phi_1$. As an example, for 66 kHz operation (which is equivalent to sampling period of 15 μsec), in the previous approach, the duration of $\Phi_1$ and $\Phi_2$ are equal to 7.5 μsec and the slew time is limited to 1.5 μsec. According to non-equal phase approach, because the duration of phase $\Phi_1$ is reduced to 3.75 μsec, the duration of integration phase $\Phi_2$ can be increased to 11.25 μsec, then the slew time can be increased to 3.25 μsec and the settling time is increased to 8 μsec. Based on this approach, the slew current is reduced to 120 μA and the amplifier static current is reduced to 240 μA. Therefore, by using the non-equal phase approach, the current consumption can be further reduced and the settling can be improved.

Although the present invention has been described with reference to preferred embodiments, workers skilled in the art will recognize that changes may be made in form and detail without departing from the spirit and scope of the invention. For example, any number of integrator stages can be used to obtain the desired accuracy. Further, other types of electrodes and electrode configurations can be used and the invention is not limited to the specific example described here.

What is claimed is:

1. A process pressure transmitter having hysteresis compensation, comprising:

an output circuit configured to provide an output related to a sensed pressure;

a pressure sensor comprising:

a pressure cell having an interior to form a main cell cavity;

a deflectable diaphragm which deflects in response to an applied pressure having a first side and a second side configured to divide the main cell cavity into first and second cavities;

first and second electrodes in the first cell cavity proximate the diaphragm configured to form respective first and second capacitors therewith;

third and fourth electrodes in the second cell cavity proximate the diaphragm configured to form respective third and fourth capacitors therewith;

an analog to digital converter coupled to the first, second, third and fourth electrodes, comprising:

a sigma delta converter having a first input coupled to the first electrode and a second input coupled to the third electrode and having an output related to the applied pressure; and at least one charge inverter amplifier including a switch capacitor to couple the second electrode to the first input of the sigma delta converter.

2. The process pressure transmitter of claim 1 wherein the third and fourth electrodes have at least a partial ring shape.

3. The process pressure transmitter of claim 1 wherein the charge inverter amplifier comprises:

a differential amplifier having an inverting input coupled to the third electrode, non-inverting input coupled to a reference and an output;

a feedback capacitor coupled between the output and the inverting input of the differential amplifier;

a switch coupled across the feedback capacitor and between the output and the inverting input of the differential amplifier.

4. The process pressure transmitter of claim 1 wherein charge inverter amplifier has a programmable gain.

5. The process pressure transmitter of claim 4 wherein the charge inverting amplifier includes a plurality capacitors selectively couplable in series with the charge inverting amplifier and the gain is a function of the capacitance value of the capacitors.

6. The process pressure transmitter of claim 1 including an open lead detector configured to detect an open electrical connection in the pressure sensor.

7. The process pressure transmitter of claim 1 including a second charge inverter amplifier to couple the fourth electrode to the second input of the sigma delta converter.

8. The process pressure transmitter of claim 1 wherein an output from the charge inverter amplifier is inversely related to a signal from the second electrode applied to an input of the amplifier.

9. The process pressure transmitter of claim 1 wherein the charge inverter amplifier includes an auto-zero phase.

10. The process pressure transmitter of claim 1 wherein the charge inverter amplifier further couples the fourth electrode to the second input of the sigma delta converter.

11. The process pressure transmitter of claim 10 further including a first and a second switch configured to selectively couple the second and fourth electrodes to the charge inverter amplifier.

12. The process pressure transmitter of claim 1 including switch control logic configured to operate the switch capacitor in the charge inverter amplifier.

13. The process pressure transmitter of claim 1 wherein the sigma delta converter includes a first stage integrator.

14. The process pressure transmitter of claim 1 including a first clock and a second clock configured to operate the charge inverter amplifier.

15. The process pressure transmitter of claim 14 wherein the first and second clocks have differing phases.

16. The process pressure transmitter of claim 1 wherein the sigma delta converter and the charge inverter amplifier are fabricated on a single integrated circuit.

17. The process pressure transmitter of claim 1 including a clock having a $\Phi_1$ phase and an $\Phi_2$ phase.

18. The process pressure transmitter of claim 17 wherein the $\Phi_1$ phase and the $\Phi_2$ phase have substantially equal durations.

19. The process pressure transmitter of claim 17 wherein the $\Phi_2$ phase has a duration which is greater than a duration of the $\Phi_1$ phase.

20. The process pressure transmitter of claim 1 including a sample and hold circuit configured to hold an output from the charge inverter amplifier.

21. The process pressure transmitter of claim 20 wherein the sample and hold comprises a capacitor and a switch.

22. An apparatus for measuring pressure, comprising:

a diaphragm configured to deflect in response to applied pressure;

first and second main capacitors having capacitance related to deflection of the diaphragm;

first and second compensation capacitors having capacitance related to deflection of the diaphragm;

a sigma delta analog to digital converter coupled to the first and second main capacitors; and a shared charge inverter amplifier coupling the first and second compensation capacitors to the sigma delta analog to digital converter.

23. The apparatus of claim 22 wherein the charge inverter amplifier includes a switch capacitor.

24. The apparatus of claim 22 wherein the sigma delta analog to digital converter and the charge inverter amplifier are carried on a single integrated circuit.

25. The apparatus of claim 22 wherein the charge inverter amplifier has a programmable gain.

26. The apparatus of claim 22 wherein the charge inverter amplifier has an auto-zero phase.

* * * * *

UNITED STATES PATENT AND TRADEMARK OFFICE
CERTIFICATE OF CORRECTION

PATENT NO.    : 6,516,672 B2
DATED         : February 11, 2003
INVENTOR(S)   : Rongtai Wang It is certified that error appears in the above-identified patent and that said Letters Patent is hereby corrected as shown below:

<u>Title page,</u>
Item [54], Title, delete "CAPACITIVE PRESSURE SENSOR AND"
Item [56], References Cited, OTHER PUBLICATIONS, references "American National Standard" change "valvues" to -- valves --.

Signed and Sealed this

Tenth Day of February, 2004

JON W. DUDAS
*Acting Director of the United States Patent and Trademark Office*